(12) United States Patent
Wang et al.

(10) Patent No.: US 12,021,173 B2
(45) Date of Patent: Jun. 25, 2024

(54) LIGHT-EMITTING DIODE CHIP HAVING A GAP BETWEEN EPITAXIAL STRUCTURES AND METHOD FOR MANUFACTURING THE SAME, AND DISPLAY DEVICE

(71) Applicant: BOE TECHNOLOGY GROUP CO., LTD., Beijing (CN)

(72) Inventors: Mingxing Wang, Beijing (CN); Binbin Tong, Beijing (CN); Lizhen Zhang, Beijing (CN); Chenyang Zhang, Beijing (CN); Zhen Zhang, Beijing (CN); Xiawei Yun, Beijing (CN); Guangcai Yuan, Beijing (CN); Xue Dong, Beijing (CN); Muxin Di, Beijing (CN); Zhiwei Liang, Beijing (CN); Ke Wang, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 402 days.

(21) Appl. No.: 17/435,016

(22) PCT Filed: Nov. 6, 2020

(86) PCT No.: PCT/CN2020/127247
§ 371 (c)(1),
(2) Date: Aug. 30, 2021

(87) PCT Pub. No.: WO2022/094967
PCT Pub. Date: May 12, 2022

(65) Prior Publication Data
US 2022/0376137 A1 Nov. 24, 2022

(51) Int. Cl.
*H01L 33/38* (2010.01)
*H01L 25/075* (2006.01)
(Continued)

(52) U.S. Cl.
CPC ........ *H01L 33/382* (2013.01); *H01L 25/0753* (2013.01); *H01L 33/005* (2013.01);
(Continued)

(58) Field of Classification Search
CPC . H01L 33/382; H01L 25/0753; H01L 33/005; H01L 33/46; H01L 33/62
See application file for complete search history.

(56) References Cited

U.S. PATENT DOCUMENTS

2009/0057693 A1 3/2009 Takeuchi et al.
2014/0361327 A1* 12/2014 Chae ............... H01L 33/12
257/98
(Continued)

FOREIGN PATENT DOCUMENTS

| CN | 101123264 A | 2/2008 |
|---|---|---|
| CN | 107994046 A | 5/2018 |

(Continued)

OTHER PUBLICATIONS

Olivier F et al., Influence of size-reduction on the performances of GaN-based micro-LEDs for display application, Journal of Luminescence, 2017, pp. 112-116, vol. 191, Part B, Elsevier B.V., http://dx.doi.org/10.1016/j.jlumin.2016.09.052.

*Primary Examiner* — Michael Jung
(74) *Attorney, Agent, or Firm* — IP & T GROUP LLP

(57) ABSTRACT

A light-emitting diode (LED) chip includes a plurality of epitaxial structures, at least one first electrode, and a plurality of second electrodes. Any two adjacent epitaxial structures of the plurality of epitaxial structures have a gap therebetween. Each epitaxial structure includes a first semiconductor pattern, a light-emitting pattern and a second semiconductor pattern stacked in sequence. First semiconductor patterns in at least two of the plurality of epitaxial structures are connected to each other to form a first semiconductor layer. A first electrode is electrically connected to
(Continued)

the first semiconductor layer. Each second electrode is electrically connected to the second semiconductor pattern in at least one of the plurality of epitaxial structures.

20 Claims, 17 Drawing Sheets

(51) Int. Cl.
*H01L 33/00* (2010.01)
*H01L 33/46* (2010.01)
*H01L 33/62* (2010.01)

(52) U.S. Cl.
CPC .............. *H01L 33/46* (2013.01); *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 2019/0139932 A1 | 5/2019 | Ting et al. | |
| 2020/0111941 A1* | 4/2020 | Xing | H01L 25/0753 |
| 2020/0203319 A1 | 6/2020 | Lee et al. | |
| 2021/0408106 A1* | 12/2021 | Kishimoto | H01L 27/156 |
| 2022/0059740 A1* | 2/2022 | Hahn | H01L 33/44 |

FOREIGN PATENT DOCUMENTS

| | | |
|---|---|---|
| CN | 110416249 A | 11/2019 |
| CN | 111106210 A | 5/2020 |
| CN | 111293134 A | 6/2020 |
| CN | 211719593 U | 10/2020 |
| WO | 2019/147589 A1 | 8/2019 |

\* cited by examiner

LIGHT-EMITTING DIODE CHIP HAVING A GAP BETWEEN EPITAXIAL STRUCTURES AND METHOD FOR MANUFACTURING THE SAME, AND DISPLAY DEVICE

CROSS-REFERENCE TO RELATED APPLICATIONS

This application is a national phase entry under 35 USC 371 of International Patent Application No. PCT/CN2020/127247, filed on Nov. 6, 2020, which is incorporated herein by reference in its entirety.

TECHNICAL FIELD

The present disclosure relates to the field of display technologies, and in particular, to a light-emitting diode (LED) chip and a method for manufacturing the same, and a display device.

BACKGROUND

Light-emitting diode (LED) has many advantages such as high efficiency, high brightness, high reliability, high energy efficiency and fast response speed. In addition, LED display devices have a clear advantage over liquid crystal display (LCD) devices and organic light-emitting diode (OLED) display devices in terms of image quality, refresh rate, power consumption, and brightness. As a result, LEDs are widely used in traditional displays, near-eye displays, three-dimensional (3D) displays, transparent displays and other fields.

SUMMARY

In one aspect, a light-emitting diode (LED) chip is provided. The LED chip includes a plurality of epitaxial structures, at least one first electrode, and a plurality of second electrodes. Any two adjacent epitaxial structures of the plurality of epitaxial structures have a gap therebetween. Each epitaxial structure includes a first semiconductor pattern, a light-emitting pattern and a second semiconductor pattern stacked in sequence. First semiconductor patterns in at least two of the plurality of epitaxial structures are connected to each other to form a first semiconductor layer. A first electrode is electrically connected to the first semiconductor layer. Each second electrode is electrically connected to the second semiconductor pattern in at least one of the plurality of epitaxial structures.

In some embodiments, the first electrode and the plurality of second electrodes are disposed on a same side of the first semiconductor layer.

In some embodiments, an orthographic projection of the first electrode on a first plane is located within an orthographic projection of the first semiconductor layer electrically connected to the first electrode on the first plane, and does not overlap with orthographic projections of the plurality of epitaxial structures on the first plane. The first plane is a plane parallel to the first semiconductor layer.

In some embodiments, an orthographic projection of the second electrode on the first plane at least partially overlaps with an orthographic projection of the second semiconductor pattern in the at least one epitaxial structure electrically connected to the second electrode on the first plane.

In some embodiments, the plurality of epitaxial structures are arranged at intervals along a first direction, and the plurality of epitaxial structures extend along a second direction. The first direction intersects the second direction.

In some embodiments, a plurality of second semiconductor patterns in the plurality of epitaxial structures are arranged at intervals along the first direction, and the second semiconductor patterns extend along the second direction.

In some embodiments, a plurality of light-emitting patterns in the plurality of epitaxial structures are arranged at intervals along the first direction, and the light-emitting patterns extend along the second direction.

In some embodiments, the plurality of epitaxial structures are arranged in an array.

In some embodiments, a plurality of second semiconductor patterns in the plurality of epitaxial structures are arranged in an array.

In some embodiments, a plurality of light-emitting patterns in the plurality of epitaxial structures are arranged in an array.

In some embodiments, the first electrode is located in the gap between at least two adjacent epitaxial structures in the plurality of epitaxial structures. The first electrode includes at least one first portion extending along a first direction and at least one second portion extending along a second direction. The first direction intersects the second direction.

In some embodiments, the first electrode is arranged around the plurality of epitaxial structures.

In some embodiments, a dimension of the gap between any two adjacent epitaxial structures of the plurality of epitaxial structures ranges from 0.01 μm to 100 μm.

In some embodiments, the LED chip further includes at least one first conductive pin and a plurality of second conductive pins. A first conductive pin is located on a side of the first electrode away from the first semiconductor layer and is electrically connected to the first electrode. Each second conductive pin is electrically connected to the second electrode.

In some embodiments, the LED chip further includes an ohmic contact layer provided between the second semiconductor pattern and the second electrode electrically connected thereto.

In some embodiments, the ohmic contact layer is a transparent ohmic contact layer or a reflective ohmic contact layer.

In another aspect, a method for manufacturing a LED chip is provided. The method includes: providing a substrate; forming a plurality of epitaxial structures on a side of the substrate, any two adjacent epitaxial structures of the plurality of epitaxial structures having a gap therebetween, each epitaxial structure including a first semiconductor pattern, a light-emitting pattern and a second semiconductor pattern stacked in sequence, and first semiconductor patterns in at least two of the plurality of epitaxial structures being connected to each other to form a first semiconductor layer; forming at least one first electrode, a first electrode being electrically connected to the first semiconductor layer; and forming a plurality of second electrodes, each second electrode being electrically connected to the second semiconductor pattern in at least one of the plurality of epitaxial structures.

In some embodiments, forming the plurality of epitaxial structures, includes: forming a first semiconductor film, a light-emitting film and a second semiconductor film on the side of the substrate in sequence; forming a conductive film on a side of the second semiconductor film away from the substrate; annealing the conductive film to form a plurality of conductive particles; and patterning the second semiconductor film, the light-emitting film and the first semiconductor film to form first semiconductor patterns, light-emitting patterns and second semiconductor patterns by using the plurality of conductive particles as a mask, so as to obtain the plurality of epitaxial structures.

In some embodiments, forming the plurality of epitaxial structures, includes: forming a first semiconductor film on the side of the substrate; forming a defining layer on the first semiconductor film away form the substrate, the defining layer having a plurality of openings; and forming a light-emitting pattern and a second semiconductor pattern in each opening in sequence, so as to obtain the plurality of epitaxial structures.

In some embodiments, forming the plurality of epitaxial structures, includes: forming a first semiconductor film and a light-emitting film on the side of the substrate in sequence; forming a defining layer on the light-emitting film away form the substrate, the defining layer having a plurality of openings; and forming a second semiconductor pattern in each opening, so as to obtain the plurality of epitaxial structures.

In yet another aspect, a display device is provided. The display device includes a driving backplane and the plurality of LED chips as described in any of the foregoing embodiments. The driving backplane includes a plurality of connection pads, and the plurality of connection pads includes a plurality of first pads and a plurality of second pads. Each first electrode in the plurality of LED chips is electrically connected to a single first pad, and each second electrode of the plurality of LED chips is electrically connected to a single second pad.

BRIEF DESCRIPTION OF THE DRAWINGS

In order to explain technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, and actual processes of methods involved in the embodiments of the present disclosure.

DETAILED DESCRIPTION

Figure 1:
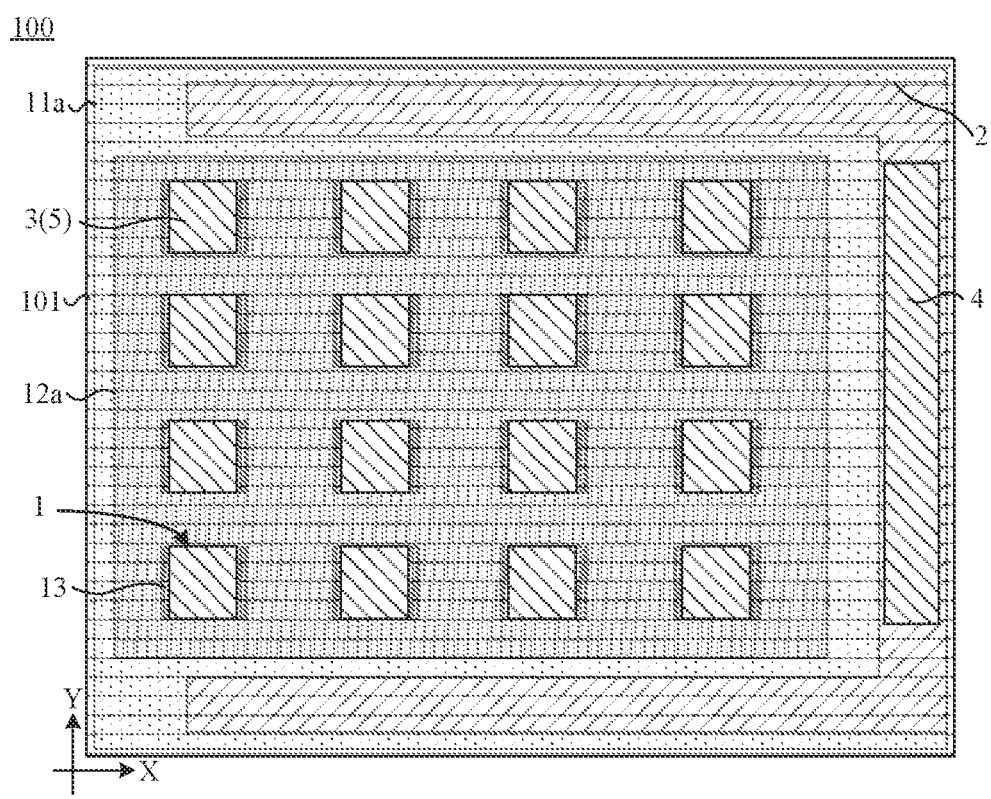
FIG. 1 is a structural diagram of a light-emitting diode (LED) chip, in accordance with some embodiments of the present disclosure.

Technical solutions in some embodiments of the present disclosure will be described clearly and completely below with reference to accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical contact or electrical contact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when", "in a case where", "in response to determining that" or "in response to detecting", depending on the context. Similarly, the phrase "if it is determined that" or "if [a stated condition or event] is detected" is optionally construed as "in a case where it is determined that" or "in response to determining that", or "in a case where [the stated condition or event] is detected" or "in response to detecting [the stated condition or event]", depending on the context.

The phrase "applicable to" or "configured to" used herein has an open and inclusive meaning, which does not exclude devices that are applicable to or configured to perform additional tasks or steps.

In addition, the phrase "based on" used herein has an open and inclusive meaning, since a process, step, calculation or other action that is "based on" one or more of the stated conditions or values may, in practice, be based on additional conditions or values exceeding those stated.

The terms "about" or "approximately" as used herein include a stated value and an average value within an acceptable range of deviation of a particular value. The acceptable range of deviation is determined by a person of ordinary skill in the art in view of the measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

In some examples, a light-emitting diode (LED) display device may include a display backplane, and a plurality of LEDs electrically connected to the display backplane. The plurality of LEDs are generally transferred onto the display backplane through a mass transfer technology. However, due to limitations of the mass transfer technology itself, a transfer efficiency and a yield of LEDs are low.

As shown in FIGS. 1 to 12, some embodiments of the present disclosure provide a light-emitting diode (LED) chip 100. The LED chip 100 is, for example, a mini light-emitting diode (Mini LED) chip or a micro light-emitting diode (Micro LED) chip.

As shown in FIGS. 4, 5, 7 and 10 to 12, the LED chip 100 includes a plurality of epitaxial structures 1.

In some examples, as shown in FIGS. 4, 5, 7 and 10 to 12, each epitaxial structure 1 includes a first semiconductor pattern 11, a light-emitting pattern 12, and a second semiconductor pattern 13 stacked in sequence. The first semiconductor pattern 11 and the light-emitting pattern 12 may be, for example, in direct contact; and the light-emitting pattern 12 and the second semiconductor pattern 13 may be, for example, in direct contact.

For example, the light-emitting pattern 12 is a multiple quantum well (MQW) layer. The light-emitting pattern 12 may be made of, for example, gallium nitride (GaN).

For example, the first semiconductor pattern 11 is made of a P-type semiconductor material, and correspondingly, the second semiconductor pattern 13 is made of an N-type semiconductor material. Alternatively, the first semiconductor pattern 11 is made of an N-type semiconductor material, and correspondingly, the second semiconductor pattern 13 is made of a P-type semiconductor material.

A material of the first semiconductor pattern 11 and a material of the second semiconductor pattern 13 may be various, and a specific material may be selected according to actual needs. For example, intrinsic semiconductor in the first semiconductor pattern 11 and the second semiconductor pattern 13 are the same material, which may be any one of GaN, gallium phosphide (GaP), aluminum gallium arsenide (AlGaAs), and aluminum gallium indium phosphide (AlGaInP).

In a case where different voltages are applied to the first semiconductor pattern 11 and the second semiconductor pattern 13 to form an electric field between the two, if the intrinsic semiconductor in the first semiconductor pattern 11 and the second semiconductor pattern 13 are both GaN, the epitaxial structure 1 may emit green light or blue light; if the intrinsic semiconductor in the first semiconductor pattern 11 and the second semiconductor pattern 13 are both made of GaP, AlGaAs or AlGaInP, the epitaxial structure 1 may emit red light.

It will be noted that in the case where the different voltages are applied to the first semiconductor pattern 11 and the second semiconductor pattern 13 to form the electric field between the two, that is, in a case where a PN junction with a potential barrier is formed between the first semiconductor pattern 11 and the second semiconductor pattern 13, when minority carriers and majority carriers recombine in an overlapping region of the first semiconductor pattern 11, the light-emitting pattern 12, and the second semiconductor pattern 13 along a direction in which they are stacked, excess energy will be released in the form of light, thereby directly converting electrical energy into light energy. Therefore, the overlapping region of the three along the direction in which they are stacked are basically a light-emitting region of the epitaxial structure 1, and an area of the overlapping region of the three along the direction in which they are stacked is basically a light-emitting area of the epitaxial structure 1.

In some examples, as shown in FIGS. 4, 5, 7 and 10 to 12, a gap exists between any two adjacent epitaxial structures 1 of the plurality of epitaxial structures. This means that each epitaxial structure 1 may have a corresponding light-emitting region. The plurality of epitaxial structures 1 included in the LED chip 100 may enable the LED chip 100 to have a plurality of light-emitting regions.

It will be noted that in a case where the LED chip 100 is applied to an LED display device, one or more (for example, two or three) light-emitting regions of the LED chip 100 may correspond to a single sub-pixel region in the LED display device. That is to say, one LED chip may correspond to a plurality of sub-pixel regions in the LED display device. In this way, in a process of transferring the LED chips 100, one LED chip 100 may cover the plurality of sub-pixel regions, which may effectively improve the transfer efficiency and yield as compared with a case where one LED needs to be transferred for each sub-pixel region.

In some examples, as shown in FIGS. 1 to 5 and FIGS. 7 to 12, a gap exists between the second semiconductor patterns 13 in different epitaxial structures 1, and different second semiconductor patterns 13 are independent of each other. For example, the gap between two adjacent second semiconductor patterns 13 may be the gap between any two adjacent epitaxial structures 1 as described above. This is beneficial to ensure that the plurality of light-emitting regions of the plurality of epitaxial structures 1 are independent of each other, and thus avoid optical crosstalk.

In terms of a manufacturing process of the epitaxial structure 1, the second semiconductor pattern 13 may be formed later than the light-emitting pattern 12 and the first semiconductor pattern 11. By arranging the plurality of second semiconductor patterns 13 in the plurality of epitaxial structures 1 to be independent of each other, it is beneficial to simplify the manufacturing process of the epitaxial structure 1 and the LED chip 100.

In some examples, as shown in FIGS. 1 to 11, the first semiconductor patterns 11 in at least two of the plurality of epitaxial structures 1 are connected to each other to form a first semiconductor layer 11a.

For example, among the plurality of epitaxial structures 1, the first semiconductor patterns 11 in two adjacent epitaxial structures 1 are connected to each other to form the first semiconductor layer 11a; or, the first semiconductor patterns 11 in four adjacent epitaxial structures 1 (which may be arranged, for example, in a shape of a Chinese character "—" in a certain direction or a Chinese character "田", etc.) are connected to each other to form the first semiconductor layer 11a; or, a plurality of first semiconductor patterns 11 in the plurality of epitaxial structures 1 are connected to each other to form the first semiconductor layer 11a; and so forth.

By connecting the first semiconductor patterns 11 in at least two epitaxial structures 1 to each other, it may be possible to reduce the number of first semiconductor patterns 11, and thus simplify a structure of the epitaxial structure 1.

For example, a portion of the first semiconductor layer 11a for connecting the at least two first semiconductor patterns 11 together may be of a same material as the first semiconductor patterns 11. As shown in FIGS. 1 to 3, 6, 8 and 9, the portion may be located in the gap between any two adjacent first semiconductor patterns 11 as mentioned above; or, it may be located beside a region defined by the at least two first semiconductor patterns 11 as a whole.

For example, the first semiconductor patterns 11 in the at least two epitaxial structures 1 and the portion for connecting the at least two first semiconductor patterns 11 together may be formed in a same patterning process by using a same film, which may help simplify the manufacturing process of the LED chip 100.

Here, a surface of the first semiconductor layer 11a proximate to the second semiconductor pattern 13 may be designed in various manners, which may be determined according to actual needs. Of course, the designs are not limited to the two examples below.

Figure 4:
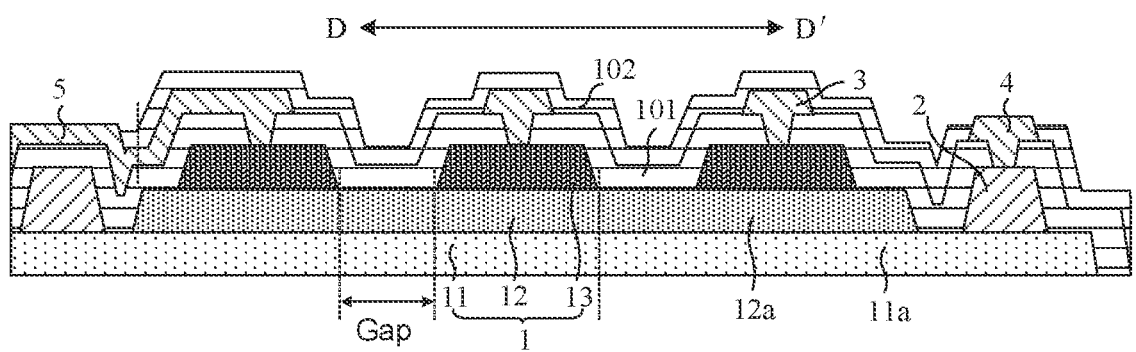
FIG. 4 is a sectional view of the LED chip shown in FIG. 3 taken along the D-D' direction.

For example, as shown in FIG. 4, the surface of the first semiconductor layer 11a proximate to the second semiconductor pattern 13 may be a relatively flat surface. That is, a surface of the portion of the first semiconductor layer 11a for connecting at least two first semiconductor patterns 11 together proximate to the second semiconductor pattern 13 may be a relatively flat surface, and a surface of a portion of the first semiconductor layer 11a that is covered by the second semiconductor pattern 13 (i.e., a surface of the first semiconductor pattern 11) proximate to the second semiconductor pattern 13 may be a relatively flat surface.

Figure 12:
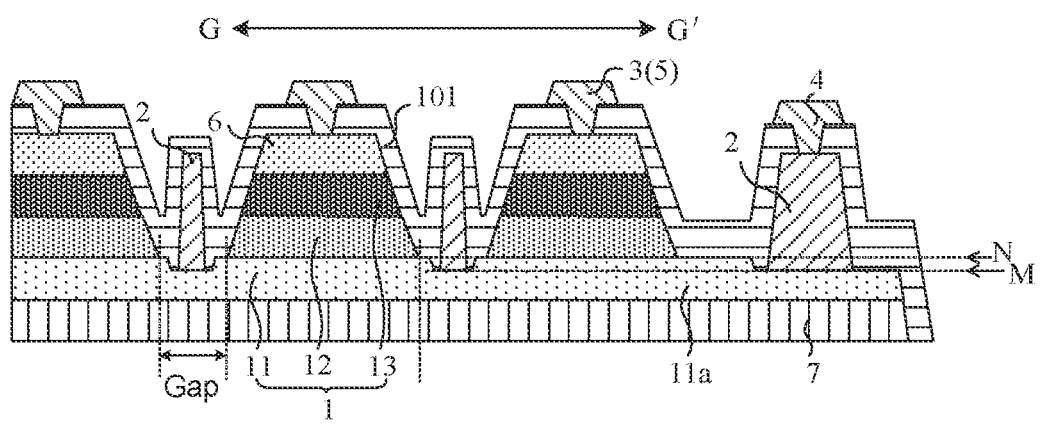
FIG. 12 is a sectional view of the LED chip shown in FIG. 9 taken along the G-G' direction.

For example, as shown in FIG. 12, the surface of the first semiconductor layer 11a proximate to the second semiconductor pattern 13 may be an uneven surface. For example, the surface of the portion of the first semiconductor layer 11a located in the gap between any two adjacent epitaxial structures 1 (i.e., the portion for connecting the at least two first semiconductor patterns 11 together) proximate to the second semiconductor pattern 13 may be located on a same plane (e.g., plane M), and the surface of the portion of the first semiconductor layer 11a that is covered by the second semiconductor pattern 13 (i.e., the surface of the first semiconductor pattern 11) proximate to the second semiconductor pattern 13 may be located on a same plane (e.g., plane N). There is a distance between the two planes, and a vertical distance between the plane M and a surface of the second semiconductor pattern 13 proximate to the first semiconductor layer 11a is greater than a vertical distance between the plane N and the surface of the second semiconductor pattern 13 proximate to the first semiconductor layer 11a.

Hereinafter, a structure of the LED chip 100 will be schematically described by taking an example in which the first semiconductor pattern 11 is an N-type semiconductor pattern and the second semiconductor pattern 13 is a P-type semiconductor pattern.

In some embodiments, as shown in FIGS. 1 to 12, the LED chip 100 further includes at least one first electrode 2 and a plurality of second electrodes 3. Each first electrode 2 is electrically connected to one first semiconductor layer 11a, and each second electrode 3 is electrically connected to the second semiconductor pattern 13 in at least one epitaxial structure 1. Each first electrode 2 may be in direct contact with the first semiconductor layer 11a electrically connected thereto, and each second electrode 3 may be in direct contact with the second semiconductor pattern 13 in the at least one epitaxial structure 1 electrically connected thereto.

In this case, the first electrode 2 may be referred to as an negative electrode, and electrons may be injected into the first semiconductor layer 11a and the light-emitting pattern 12 through the first electrode 2. The second electrode 3 may be referred to as a positive electrode, and holes may be injected into the corresponding second semiconductor pattern 13 and the light-emitting pattern 12 through the second electrode 3. The electrons and holes may recombine in the light-emitting pattern 12 to emit light.

In some examples, as shown in FIGS. 1 to 3, 8 and 9, an orthographic projection of the first electrode 2 on a first plane is located within an orthographic projection of the first semiconductor layer 11a electrically connected to the first electrode 2 on the first plane, and does not overlap with orthographic projections of the plurality of epitaxial structures 1 on the first plane. The first plane is a plane parallel to the first semiconductor layer 11a.

Figure 2:
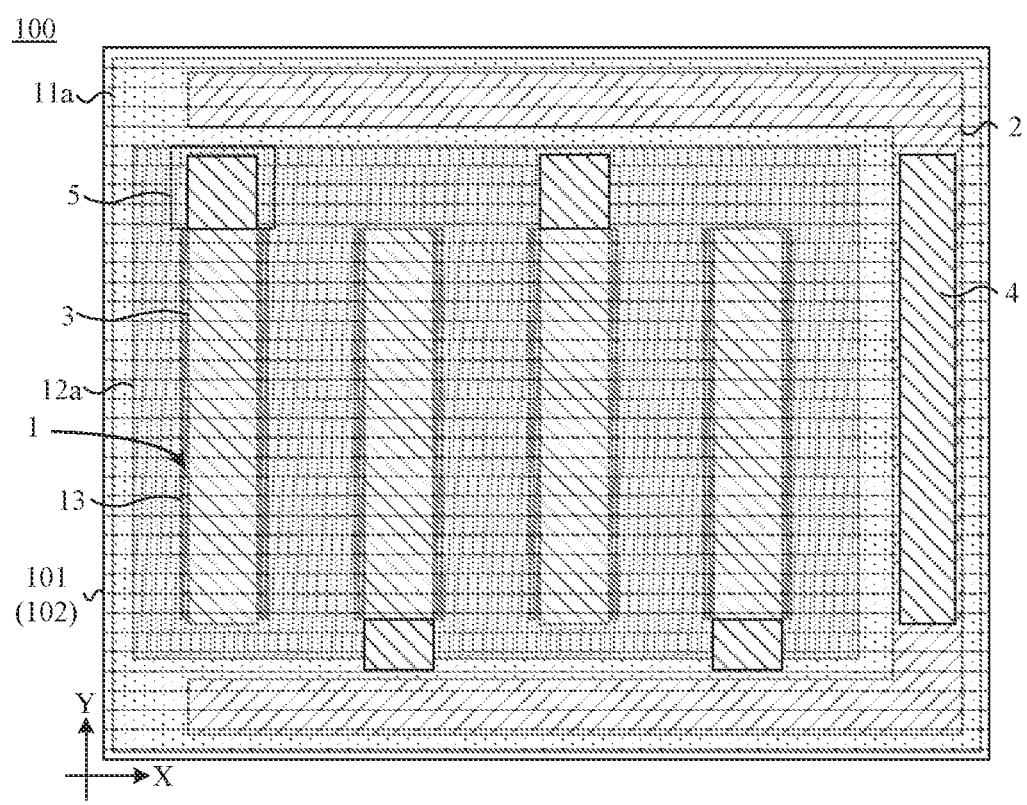
FIG. 2 is a structural diagram of another LED chip, in accordance with some embodiments of the present disclosure.

For example, the description that the orthographic projection of the first electrode 2 on the first plane is located within the orthographic projection of the first semiconductor layer 11a electrically connected to the first electrode 2 (in this paragraph, "the first semiconductor layer 11a electrically connected to the first electrode 2" is referred to as "the first semiconductor layer 11a" for simplicity reasons) on the first plane, includes the following situations: an area of the orthographic projection of the first electrode 2 on the first plane is less than an area of the orthographic projection of the first semiconductor layer 11a on the first plane, a boundary of the orthographic projection of the first electrode 2 on the first plane and a boundary of the orthographic projection of the first semiconductor layer 11a on the first plane do not cross, and a distance between the boundaries of the orthographic projection of the first electrode 2 on the first plane and the orthographic projection of the first semiconductor layer 11a on the first plane is greater than 0 (as shown in FIG. 2); or, a portion of the boundary of the orthographic projection of the first electrode 2 on the first plane coincides with a portion of the boundary of the first semiconductor layer 11a on the first plane, and a distance between another portion of the boundary of the orthographic projection of the first electrode 2 on the first plane and another portion of the boundary of the orthographic projection of the first semiconductor layer 11a on the first plane is greater than 0 (as shown in FIG. 1).

By setting a positional relationship between the orthographic projection of the first electrode 2 on the first plane, the orthographic projection of the first semiconductor layer 11a electrically connected to the first electrode 2 on the first plane, and the orthographic projections of the plurality of epitaxial structures 1 on the first plane in the above manner, it may be possible to avoid a situation where the first electrode 2 directly contacts the light-emitting pattern 12 or the second semiconductor pattern 13. Moreover, in a case where the LED chip 100 includes a plurality of first semiconductor layers 11a (for example, the first semiconductor patterns 11 in some epitaxial structures 1 in the LED chip 100 are connected to each other to form a first semiconductor layer 11a, and the first semiconductor patterns 11 in some other epitaxial structures 1 are connected to each other to form another first semiconductor layer 11a), it may be possible to avoid signal crosstalk between different first semiconductor layers 11a.

In some examples, the number of the first electrodes 2 may be determined according to the number of the first semiconductor layers 11a. That is, the number of the first electrodes 2 may be the same as the number of the first semiconductor layers 11a.

Based on this, at least two epitaxial structures 1 corresponding to the first semiconductor layer 11a may share one first electrode 2. In this way, in a case where electrons are injected into the first conductor layer 11a and the light-emitting patterns 12 in the at least two epitaxial structures 1 through the first electrode 2, the amounts of electrons injected into the at least two epitaxial structures 1 may be equal or substantially equal. This may help reduce a current difference between the at least two epitaxial structures 1 and improve a current uniformity of the at least two epitaxial structures 1. Moreover, the number of first electrodes 2 may be reduced, so that more epitaxial structures 1 may be provided in one LED chip 100. In this way, the structure of the LED chip 100 may be simplified.

For example, the plurality of first semiconductor patterns 11 in the plurality of epitaxial structures 1 are connected to each other to form a first semiconductor layer 11a. In this case, the number of the first semiconductor layers 11a is one, and the number of the first electrodes 2 electrically connected to the first semiconductor layer 11a may be one. In this way, the amounts of electrons injected into all the epitaxial structures 1 may be equal or substantially equal. This helps further improve the current uniformity of all the epitaxial structures 1, so that more epitaxial structures 1 may be provided in one LED chip 100. In this way, the structure of the LED chip 100 may be further simplified.

In some examples, as shown in FIGS. 1 to 12, each second electrode 3 may be electrically connected to the second semiconductor pattern 13 in one epitaxial structure 1, or may be electrically connected to the second semiconductor patterns 13 in epitaxial structures 1, for example, two or three epitaxial structures 1.

For example, if each second electrode 3 is electrically connected to the second semiconductor pattern 13 in one epitaxial structure 1, the number of the second electrodes 3 is equal to the number of the epitaxial structures 1. In this case, the second electrodes 3 may be used to realize independent control of the light-emitting states of respective epitaxial structures 1.

For example, if each second electrode 3 is electrically connected to the second semiconductor patterns 13 in epitaxial structures 1, the number of second electrodes 3 is greater than or equal to two, and less than the number of all the epitaxial structures 1. In this case, each second electrode 3 may be used to realize independent control of the light-emitting states of the epitaxial structures 1 electrically connected thereto.

In some examples, as shown in FIGS. 1 to 12, the orthographic projection of each second electrode 3 on the first plane at least partially overlaps with an orthographic projection of the second semiconductor pattern 13 in the at least one epitaxial structure 1 electrically connected to the second electrode 3 on the first plane.

Figure 3:
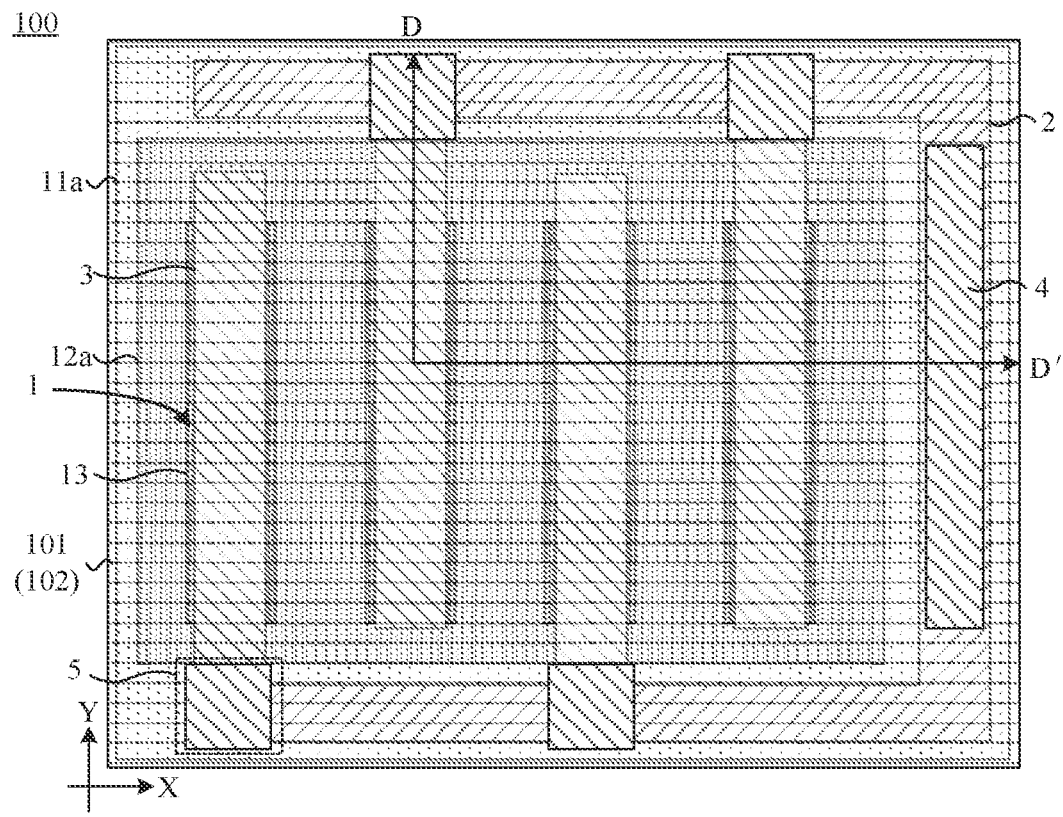
FIG. 3 is a structural diagram of yet another LED chip, in accordance with some embodiments of the present disclosure.
Figure 6:
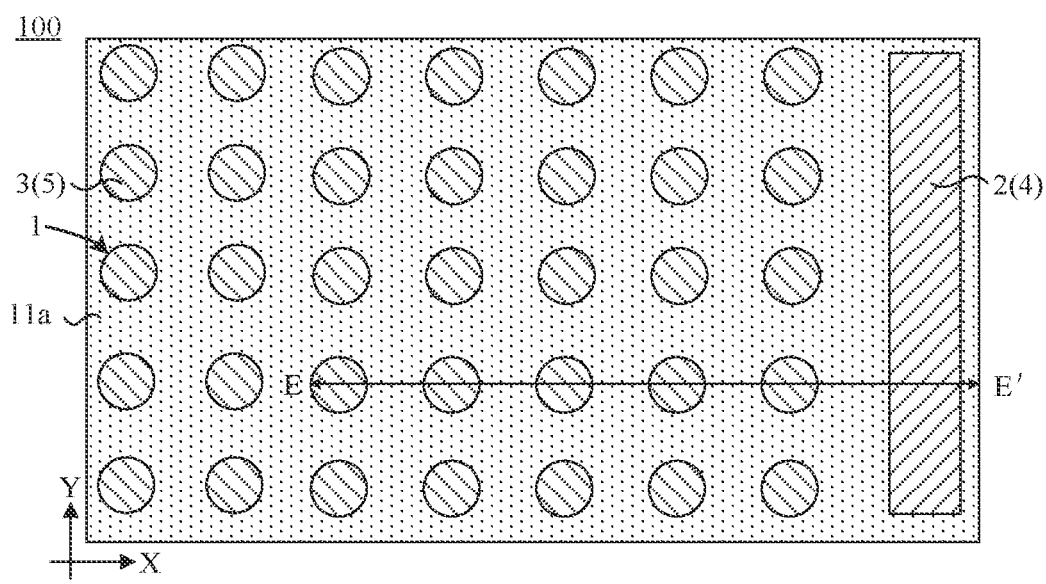
FIG. 6 is a structural diagram of yet another LED chip, in accordance with some embodiments of the present disclosure.
Figure 8:
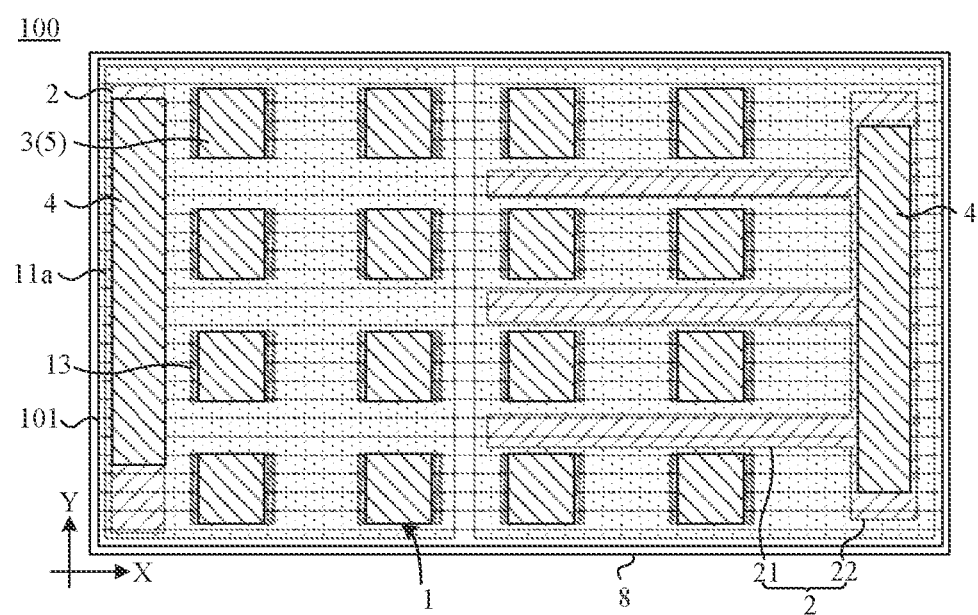
FIG. 8 is a structural diagram of yet another LED chip, in accordance with some embodiments of the present disclosure.
Figure 9:
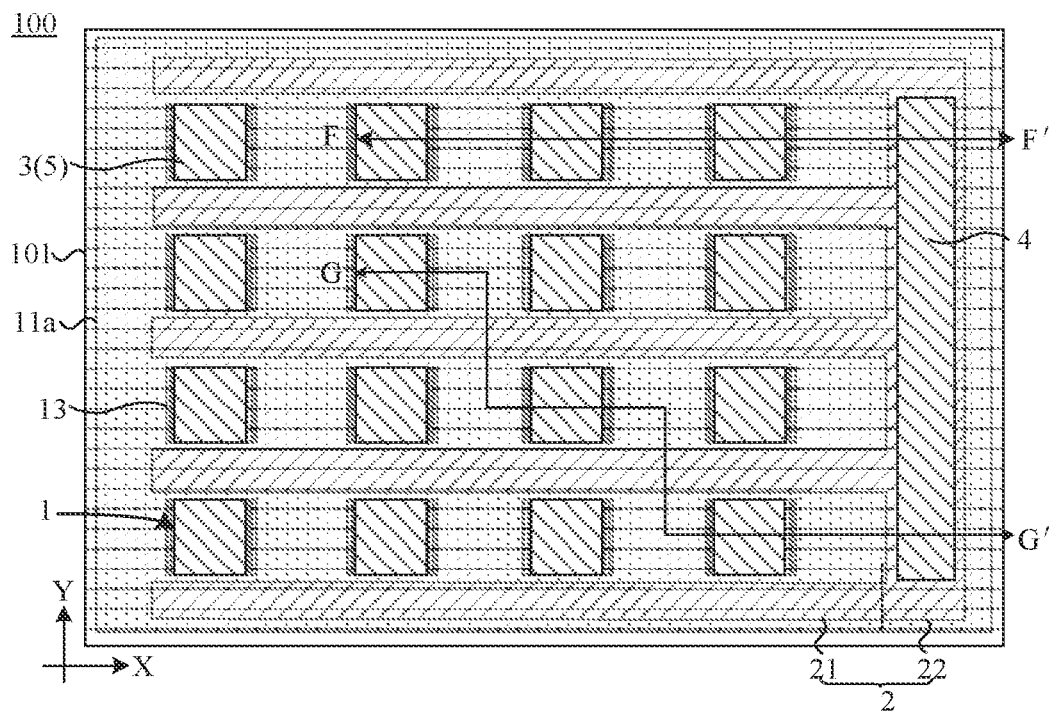
FIG. 9 is a structural diagram of yet another LED chip, in accordance with some embodiments of the present disclosure.
Figure 10:
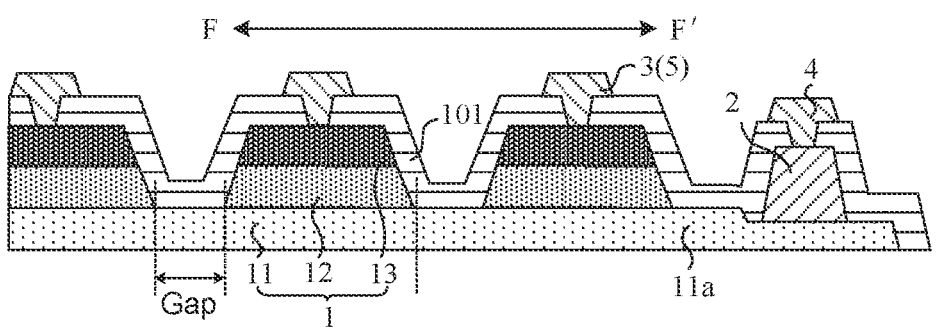
FIG. 10 is a sectional view of the LED chip shown in FIG. 9 taken along the F-F' direction.

Here, in an example where each second electrode 3 is electrically connected to the second semiconductor pattern 13 in one epitaxial structure 1, the description that the orthographic projection of the second electrode 3 on the first plane at least partially overlaps with an orthographic projection of the second semiconductor pattern 13 electrically connected to the second electrode 3 (in this paragraph, "the second semiconductor pattern 13 electrically connected to the second electrode 3" is referred to as "the second semiconductor pattern 13" for simplicity reasons) on the first plane, includes the following situations: as shown in FIGS. 2 and 3, a portion of the orthographic projection of the second electrode 3 on the first plane overlaps with a portion of the orthographic projection of the second semiconductor pattern 13 on the first plane, and another portion of the orthographic projection of the second electrode 3 on the first plane does not overlap with another portion of the orthographic projection of the second semiconductor pattern 13 on the first plane; or, as shown in FIG. 6, the orthographic projection of the second electrode 3 on the first plane coincides with the orthographic projection of the second semiconductor pattern 13 on the first plane; or, as shown in FIGS. 8 and 9, the orthographic projection of the second electrode 3 on the first plane is located within the orthographic projection of the second semiconductor pattern 13 on the first plane.

By setting a positional relationship between the orthographic projection of each second electrode 3 on the first plane and the orthographic projection of the second semiconductor pattern 13 in the at least one epitaxial structure 1 electrically connected to the second electrode 3 on the first plane in the above manner, it may be possible to ensure a relative large electrical connection area between each second electrode 3 and the second semiconductor pattern 13 in the at least one epitaxial structure 1 electrically connected to the second electrode 3, and thus ensure a good electrical connection between the two.

In the LED chip 100 provided in some embodiments of the present disclosure, by arranging the plurality of epitaxial structures 1 in the stated manner and by providing a gap between any two adjacent epitaxial structures of the plurality of epitaxial structures 1, it may be possible to make the LED chip 100 have a plurality of light-emitting regions that are arranged at intervals and can be independently controlled. In a case of applying the LED chip 100 to an LED display device, it may be arranged that one or more light-emitting regions of the LED chip 100 correspond to single sub-pixel region in the LED display device. That is, one LED chip 100 may correspond to a plurality of sub-pixel regions in the LED display device. In this way, in the process of transferring the LED chips 100, one LED chip 100 may cover the plurality of sub-pixel regions, which may effectively improve the transfer efficiency and yield as compared with the case where one LED needs to be transferred for each sub-pixel region.

Moreover, by connecting the first semiconductor patterns 11 in at least two of the plurality of epitaxial structures 1 to each other to form a first semiconductor layer 11a, and by electrically connecting each first electrode 2 to one first semiconductor layer 11a, it may be possible to improve the current uniformity of different epitaxial structures 1, and simplify the structure of the LED chip 100.

It will be noted that, how the plurality of epitaxial structures 1 are arranged and how the first electrode(s) 2 and the second electrodes 3 are arranged in the LED chip 100 are related to a shape of the epitaxial structure 1, which may be determined according to actual needs.

In some embodiments, as shown in FIGS. 2 and 3, the plurality of epitaxial structures 1 are arranged at intervals along a first direction X, and each epitaxial structure 1 extends along a second direction Y, the first direction X intersecting the second direction Y. This means that the orthographic projections of the plurality of epitaxial structures 1 on the first plane may be in a shape of, for example, a quadrilateral or a bar, and a dimension of each epitaxial structure 1 in the second direction Y is greater or much greater than a dimension of the epitaxial structure 1 in the first direction X.

For example, as shown in FIGS. 2 and 3, the plurality of epitaxial structures 1 may be arranged parallel to each other, and arranged in one or more rows along the first direction X.

Here, an angle between the first direction X and the second direction Y may be set according to actual needs. For example, the angle between the first direction X and the second direction Y may be 85°, 89°, 90°, etc.

By arranging the plurality of epitaxial structures 1 in the above manner, it may be possible to make full use of the limited area of the LED chip 100 and arrange more epitaxial structures 1 in the limited area, so that the LED chip 100 have more light-emitting regions. In this way, in the case of applying the LED chip 100 to the LED display device, it may be possible to make the LED chip 100 correspond to more sub-pixel regions. As a result, in the process of transferring the LED chip 100, one LED chip 100 may cover a plurality of sub-pixel regions, which may effectively improve the transfer efficiency and yield as compared with the case where one LED needs to be transferred for each sub-pixel region.

For example, as shown in FIGS. 2 and 3, in the first direction X, a distance between every two adjacent epitaxial structures 1 is equal or approximately equal. That is, the plurality of epitaxial structures 1 may be arranged at equal intervals.

In this way, the distribution uniformity of the plurality of epitaxial structures 1 in the LED chip 100 may be improved, and the distribution uniformity of the plurality of light-emitting regions may be improved. Further, even more epitaxial structures 1 may be arranged in the limited area of the LED chip 100, thereby further improving the transfer efficiency and yield.

Based on this, in some examples, as shown in FIGS. 2 and 3, the plurality of second semiconductor patterns 13 in the plurality of epitaxial structures 1 are arranged at intervals along the first direction X, and each second semiconductor pattern 13 extends along the second direction Y. That is, the orthographic projection of each second semiconductor pattern 13 on the first plane may be in a shape of a quadrilateral or a bar, and the dimension of each second semiconductor pattern 13 in the second direction Y is greater or much greater than the dimension of the second semiconductor pattern 13 in the first direction X.

For example, the shape of the orthographic projection of each second semiconductor pattern 13 on the first plane may be the same or approximately the same as the shape of the orthographic projection of the epitaxial structure 1 to which the second semiconductor pattern 13 belongs on the first plane.

For example, in the case where the orthographic projection of the epitaxial structure 1 on the first plane is in the shape of the quadrilateral, the orthographic projection of the second semiconductor pattern 13 in the epitaxial structure 1 on the first plane may also be in the shape of the quadrilateral. In the case where the orthographic projection of the epitaxial structure 1 on the first plane is in the shape of the bar, the orthographic projection of the second semiconductor pattern 13 in the epitaxial structure 1 on the first plane may also be in the shape of the bar.

For example, a size of the orthographic projection of each second semiconductor pattern 13 on the first plane may be the same or approximately the same as a size of the orthographic projection of the epitaxial structure 1 to which the second semiconductor pattern 13 belongs on the first plane.

Here, the description that the sizes of the two projections are the same or approximately the same may mean that, on a basis that the orthographic projection of the second semiconductor pattern 13 on the first plane and the orthographic projection of the epitaxial structure 1 to which the second semiconductor pattern 13 belongs on the first plane are of the same or approximately the same shape, the orthographic projection of the second semiconductor pattern 13 on the first plane is located within the orthographic projection of the light-emitting pattern 12 or the first semiconductor pattern 11 on the first plane, or the orthographic projection of the second semiconductor pattern 13 on the first plane coincides with or approximately coincides with the orthographic projection of the light-emitting pattern 12 or the first semiconductor pattern 11 on the first plane.

By limiting the shape and size of each second semiconductor pattern 13, it may be possible to make the orthographic projection of the second semiconductor pattern 13 on the first plane have a relatively large area, so that an area where the second semiconductor pattern 13 directly faces the light-emitting pattern 12 and the first semiconductor pattern 11 in a same epitaxial structure 1 may be relatively large. This helps further ensure that the light-emitting region of each epitaxial structure 1 has a relatively large area.

In some examples, the plurality of light-emitting patterns 12 in the plurality of epitaxial structures 1 may be arranged in various ways.

For example, the plurality of light-emitting patterns 12 in the plurality of epitaxial structures 1 are arranged independently of each other at intervals. In this case, the plurality of light-emitting patterns 12 may be arranged at intervals along the first direction X, and each light-emitting pattern 12 may extend along the second direction Y. That is, an orthographic projection of each light-emitting pattern 12 on the first plane may be in the shape of the quadrilateral or the bar, and a dimension of each light-emitting pattern 12 in the second direction Y is greater or much greater than a dimension of the light-emitting pattern 12 in the first direction X.

Here, the orthographic projection of each light-emitting pattern 12 on the first plane may be in the same or approximately the same shape as the orthographic projection of the second semiconductor pattern 13 in the epitaxial structure 1 to which the light-emitting pattern 12 belongs on the first plane. As for an example where the shapes of the orthographic projections of the two are the same or approximately the same, reference may be made to the schematic description of the orthographic projections of the second semiconductor pattern 13 and the epitaxial structure 1 on the first plane.

In the embodiments of the present disclosure, by arranging the light-emitting patterns 12 in the above manner, it may help ensure that an area where the light-emitting pattern 12 directly faces the second semiconductor pattern 13 and the first semiconductor pattern 11 in a same epitaxial structure 1 is relatively large, so as to ensure that the light-emitting region of each epitaxial structure 1 has a relatively large area.

Figure 5:
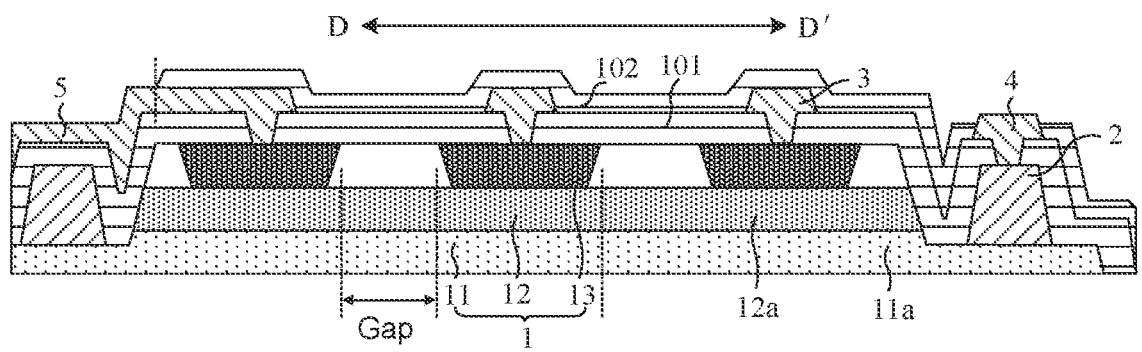
FIG. 5 is another sectional view of the LED chip shown in FIG. 3 taken along the D-D' direction.

For example, as shown in FIGS. 4 and 5, the light-emitting patterns 12 in at least two epitaxial structures 1 in the plurality of epitaxial structures 1 are connected to each other to form a light-emitting layer 12a. The epitaxial structures 1 to which the light-emitting layer 12a belongs and the epitaxial structures 1 to which the first semiconductor layer 11a belongs may be, for example, the same.

Here, a portion of the light-emitting layer 12a for connecting the at least two light-emitting patterns 12 together may be, for example, located in the gap between the at least two epitaxial structures 1, and the portion of the light-emitting layer 12a for connecting the at least two light-emitting patterns 12 together may be, for example, made of the same material as the light-emitting pattern 12.

In this way, in a process of manufacturing the light-emitting layer 12a, the plurality of light-emitting patterns and the portions for connecting the plurality of light-emitting patterns together may be formed in a same patterning process by using a same film, so as to obtain the light-emitting layer 12a. In this way, it may be possible to omit a process of patterning portions of the film located in the gaps between two adjacent epitaxial structures 1. This not only helps simplify the manufacturing process of the LED chip 100, but also prevents the patterning process from affecting properties of a material (or qualities of crystals in the material) of edge portions of the light-emitting pattern 12. As a result, it may be ensured that each epitaxial structure 1 and the LED chip 100 having the plurality of epitaxial structures 1 have good light-emitting performance.

Here, in the case where the light-emitting patterns 12 in at least two of the plurality of epitaxial structures 1 are connected to each other to form the light-emitting layer 12a, and the first semiconductor patterns 11 in the at least two epitaxial structures 1 are connected to each other to form the first semiconductor layer 11a, an area of the orthographic projection of the light-emitting layer 12a on the first plane is less than the area of the orthographic projection of the first semiconductor layer 11a on the first plane. In this case, the light-emitting layer 12a does not completely cover the first semiconductor layer 11a, and a part of a surface of the first semiconductor layer 11a is exposed, thus leaving a space for placing the first electrode 2 and facilitating the electrical connection between the first semiconductor layer 11a and the first electrode 2.

In some examples, as shown in FIGS. 2 and 3, the first electrode 2 may be arranged around the plurality of epitaxial structures 1.

Herein, "around" means that the first electrode 2 may be located on one side, two sides, three sides, or all sides of a region defined by the plurality of epitaxial structures 1 as a whole.

For example, in a case where the first semiconductor patterns 11 of some of the plurality of epitaxial structures 1 are connected to each other to form the first semiconductor layer 11a, the LED chip 100 may include a plurality of first electrodes 2, and the plurality of the first electrode 2 may be located on one side (for example, the orthographic projection of the first electrode 2 on the first plane may be in the shape of a bar), two sides (for example, the orthographic projection of the first electrode 2 on the first plane may be in the shape of a polyline), three sides (for example, the orthographic projection of the first electrode 2 on the first plane may be in the shape of a polyline), or all sides of the region defined by the plurality of epitaxial structures 1 as a whole, and the orthographic projection of each first electrode 2 on the first plane is located within the orthographic projection of the first semiconductor layer 11a electrically connected thereto on the first plane. In a case where the plurality of first electrodes 2 are located on all sides of the region defined by the plurality of epitaxial structures 1 as a whole, there are gaps between the plurality of first electrodes 2, which are not connected.

For example, in a case where the plurality of first semiconductor patterns 11 in the plurality of epitaxial structures 1 are connected to each other to form the first semiconductor layer 11a, the LED chip 100 may include only one first electrode 2, and the first electrode 2 may be located on one side, two sides, three sides, or all sides of the region defined by the plurality of epitaxial structures 1 as a whole. In a case where the first electrode 2 is located on all sides of the region defined by the plurality of epitaxial structures 1 as a whole, the first electrode 2 may be in a shape of a circle and forms a closed pattern; or, the first electrode 2 is not connected end to end, and thus does not form a closed pattern.

In some examples, as shown in FIGS. 2 and 3, the second electrodes 3 electrically connected to the second semiconductor patterns 13 may be, for example, arranged at intervals along the first direction X.

For example, in a case where the second electrodes 3 and the second semiconductor patterns 13 are electrically connected in one-to-one correspondence, each second electrode 3 may also extend along the second direction Y. In this case, the orthographic projection of the second electrode 3 on the first plane may also be in the shape of the quadrilateral or the bar, and a dimension of each second electrode 3 in the second direction Y is greater or much greater than a dimension of the second electrode 3 in the first direction X.

For another example, in a case where the second electrode 3 is electrically connected to second semiconductor patterns 13, the orthographic projection of the second electrode 3 on the first plane may be in the same shape as a pattern formed by connecting the orthographic projections of the plurality of second electrodes 3 on the plane in the above example.

In this example, as shown in FIGS. 2 and 3, the orthographic projection of the second semiconductor pattern 13 on the first plane may at least partially overlap with the orthographic projection of the second electrode 3 electrically connected to the second semiconductor pattern 13 on the first plane.

For example, the orthographic projection of the second semiconductor pattern 13 on the first plane partially overlaps with the orthographic projection of the second electrode 3 electrically connected to the second semiconductor pattern 13 on the first plane.

For another example, the orthographic projection of the second semiconductor pattern 13 on the first plane is located within the orthographic projection of the second electrode 3 electrically connected to the second semiconductor pattern 13 on the first plane.

This may help ensure a relative large contact area between the second semiconductor pattern 13 and the second electrode 3 electrically connected to the second semiconductor pattern 13, and thus ensure a good electrical contact between the two and improve the electrical properties of the LED chip 100.

In some other embodiments, as shown in FIGS. 1, 6, 8 and 9, the plurality of epitaxial structures 1 are arranged in an array. That is, the plurality of epitaxial structures 1 are arranged in multiple rows of epitaxial structures 1 along the first direction X, and arranged in multiple columns of epitaxial structures 1 along the second direction Y. Each row of epitaxial structures 1 includes epitaxial structures 1 arranged at intervals, and each column of epitaxial structures 1 includes epitaxial structures 1 arranged at intervals.

Here, as for the first direction X and the second direction Y, reference may be made to the schematic description in the foregoing embodiments, and details are not repeated here.

For example, the plurality of epitaxial structures 1 may be arranged in four rows along the first direction X, and in four columns along the second direction Y; or, the plurality of epitaxial structures 1 may be arranged in five rows along the first direction X, and in seven columns along the second direction Y.

In this case, there is little or no difference between the dimensions, in the first direction X and in the second direction Y, of respective orthographic projections of every two adjacent epitaxial structures on the first plane.

For example, as shown in FIGS. 1, 6, 8 and 9, shapes of the orthographic projections of the plurality of epitaxial structures 1 on the first plane may include at least one of a polygon (for example, a triangle, a rectangle, or a hexagon), a circle and an ellipse.

By arranging the plurality of epitaxial structures 1 in the above manner, more epitaxial structures 1 may be provided in the limited area of the LED chip 100, and the LED chip 100 may have more light-emitting regions. In this way, in a case where the LED chip 100 is applied to the LED display device, the LED chip 100 may correspond to more sub-pixel regions. Therefore, in the process of transferring the LED chips 100, one LED chip 100 may cover a plurality of sub-pixel regions, which may effectively improve the transfer efficiency and yield as compared with the case where one LED needs to be transferred for each sub-pixel region.

For example, the orthographic projections of the plurality of epitaxial structures 1 on the first plane may be of the same or substantially the same shape (for example, they are all in the shape of the rectangle or the circle, etc.), and distances between every two adjacent epitaxial structures 1 are equal or approximately equal. That is, the plurality of epitaxial structures 1 are arranged at equal intervals.

In this way, the distribution uniformity of the plurality of epitaxial structures 1 in the LED chip 100 may be improved, and the distribution uniformity of the plurality of light-emitting regions may be improved. Further, even more epitaxial structures 1 may be arranged in the limited area of the LED chip 100, thereby further improving the transfer efficiency and yield.

For example, sizes of the orthographic projections of the plurality of epitaxial structures 1 on the first plane are equal or approximately equal. In this way, the areas of the light-emitting regions of the light-emitting structures 1 may be equal or approximately equal.

Based on this, in some examples, as shown in FIGS. 1, 6, 8 and 9, the plurality of second semiconductor patterns 13 in the plurality of epitaxial structures 1 may be arranged in an array.

For example, the orthographic projection of each second semiconductor pattern 13 on the first plane may be of the same or approximately the same shape as the orthographic projection of the epitaxial structure 1 to which the second semiconductor pattern 13 belongs on the first plane.

For example, in a case where the orthographic projection of the epitaxial structure 1 on the first plane is in the shape of a circle (or a square), the orthographic projection of the second semiconductor pattern 13 in the epitaxial structure 1 on the first plane may also be in the shape of a circle (or a square).

For example, the size of the orthographic projection of each second semiconductor pattern 13 on the first plane may be the same or approximately the same as the size of the orthographic projection of the epitaxial structure 1 to which the second semiconductor pattern 13 belongs on the first plane.

Here, the description that the sizes of the two projections are the same or approximately the same means that, on a basis that the orthographic projection of the second semiconductor pattern 13 on the first plane is of the same or approximately the same shape as the orthographic projection of the epitaxial structure 1 to which the second semiconductor pattern 13 belongs on the first plane, the orthographic projection of the second semiconductor pattern 13 on the first plane is located within the orthographic projection of the light-emitting pattern 12 or the first semiconductor pattern 11 on the first plane, or the orthographic projection of the second semiconductor pattern 13 on the plane coincides with or approximately coincides with the orthographic projection of the light-emitting pattern 12 or the first semiconductor pattern 11 on the first plane.

By limiting the shape and size of each second semiconductor pattern 13, it may be possible to make the orthographic projection of the second semiconductor pattern 13 on the first plane have a relatively large area, so that an area where the second semiconductor pattern 13 directly faces the light-emitting pattern 12 and the first semiconductor pattern 11 in a same epitaxial structure 1 may be relatively large. This helps further ensure that the light-emitting region of each epitaxial structure 1 has a relatively large area.

In some examples, the plurality of light-emitting patterns 12 in the plurality of epitaxial structures 1 may be arranged in various manners.

For example, as shown in FIG. 12, the plurality of light-emitting patterns 12 in the plurality of epitaxial structures 1 are arranged independently of each other and at intervals. In this case, the plurality of light-emitting patterns 12 may be arranged in an array. The orthographic projection of each light-emitting pattern 12 on the first plane may be in the shape of a polygon, a circle, an ellipse, etc., and there is little or no difference between respective dimensions of the light-emitting patterns 12 in the first direction X and in the second direction Y.

Here, the orthographic projection of each light-emitting pattern 12 on the first plane may be of the same or approximately the same shape as the orthographic projection of the second semiconductor pattern 13 in the epitaxial structure 1 to which the light-emitting pattern 12 belongs on the first plane. As for an example where the orthographic projections of the two are the same or approximately the same, reference may be made to the schematic description of the relationship between the orthographic projections of the second semiconductor pattern 13 and the epitaxial structure 1 on the first plane.

In the embodiments of the present disclosure, by arranging the light-emitting patterns 12 in the above manner, it may help ensure that an area where each light-emitting pattern 12 directly faces the second semiconductor pattern 13 is relatively large, thereby ensuring that the light-emitting region of each epitaxial structure 1 have a relatively large area.

Figure 11:
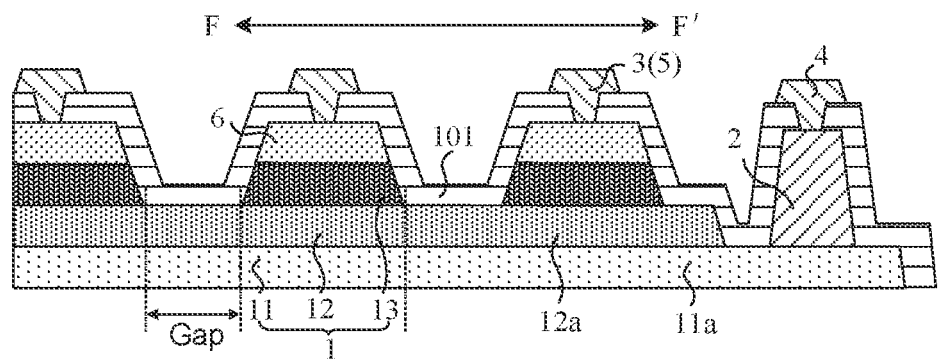
FIG. 11 is another sectional view of the LED chip shown in FIG. 9 taken along the F-F' direction.

For example, as shown in FIGS. 5 and 11, the light-emitting patterns 12 in at least two of the plurality of epitaxial structures 1 are connected to each other to form a light-emitting layer 12a. The epitaxial structures 1 to which the light-emitting layer 12a belongs and the epitaxial structures 1 to which the first semiconductor layer 11a belongs may be, for example, the same.

Here, a portion of the light-emitting layer 12a for connecting the at least two light-emitting patterns 12 together may be, for example, located in the gap between the at least two epitaxial structures 1, and may be, for example, made of the same material as the light-emitting pattern 12.

In this way, in a process of manufacturing the light-emitting layer 12a, the plurality of light-emitting patterns and the portions of the light-emitting layer 12a for connecting the plurality of light-emitting patterns together may be formed in a same patterning process by using a same film, so as to obtain the light-emitting layer 12a. In this way, it may be possible to omit a process of patterning the portions of the film located in the gaps between two adjacent epitaxial structures 1. This not only helps simplify the manufacturing process of the LED chip 100, but also prevents the patterning process from affecting properties of a material (or qualities of crystals in the material) of edge portions of the light-emitting pattern 12. As a result, it may be ensured that each epitaxial structure 1 and the LED chip 100 having the plurality of epitaxial structures 1 have good light-emitting performance.

Here, in the case where the light-emitting patterns 12 in at least two of the plurality of epitaxial structures 1 are connected to each other to form the light-emitting layer 12a, and the first semiconductor patterns 11 in the at least two epitaxial structures 1 are connected to each other to form the first semiconductor layer 11a, the area of the orthographic projection of the light-emitting layer 12a on the first plane is less than the area of the orthographic projection of the first semiconductor layer 11a on the first plane. In this case, the light-emitting layer 12a does not completely cover the first semiconductor layer 11a, and a part of the surface of the first semiconductor layer 11a is exposed, thus leaving a space for placing the first electrode 2 and facilitating the electrical connection between the first semiconductor layer 11a and the first electrode 2.

Here, the first electrode 2 may be arranged in various manners, which manner to choose is related to how the light-emitting patterns 12 are arranged, and a specific arrangement manner may be determined according to actual needs.

In some examples, in the case where the light-emitting patterns 12 of at least two of the plurality of epitaxial structures 1 are connected to each other to form the light-emitting layer 12a, the first electrode 2 may be arranged around the plurality of epitaxial structures 1.

For example, as for a positional relationship between the first electrode 2 and the plurality of epitaxial structures 1, reference may be made to the schematic description of "around" in the foregoing embodiments, and details will not repeated here.

In some other examples, as shown in FIGS. 8 and 9, in the case where the light-emitting patterns 12 of at least two of the plurality of epitaxial structures 1 are arranged independently of each other at intervals, the first electrode 2 may be located in the gap between the at least two adjacent epitaxial structures 1 in the plurality of epitaxial structures 1, and the first electrode 2 includes at least one first portion 21 extending along the first direction X and at least one second portion 22 extending along the second direction Y.

Here, an example is taken in which the plurality of first semiconductor patterns 11 in the plurality of epitaxial structures 1 are connected to each other to form the first semiconductor layer 11a, so that the arrangement of the first electrode 2 may be described more clearly.

For example, in a case where the plurality of light-emitting patterns 12 in the plurality of epitaxial structures 1 are arranged independently of each other at intervals, the plurality of light-emitting patterns 12 expose portions of the first semiconductor layer 11a located in the gaps between every two adjacent epitaxial structures. The plurality of light-emitting patterns 12a further expose a portion of the first semiconductor layer 11a that is located around the plurality of epitaxial structures 1 and surrounds the plurality of epitaxial structures 1.

In this case, as shown in FIGS. 8 and 9, the first electrode 2 may include a plurality of first portions 21 and at least one (for example, one or more) second portion 22. Each first portion 21 of the first electrode 2 may be, for example, located in a gap between any two adjacent rows of epitaxial structures 1 that are arranged along the first direction X, and extend out of a region defined by the any two adjacent rows of epitaxial structures 1. The second portion 22 of the first electrode 2 may be connected to end portions, which extend beyond the region defined by the any two adjacent rows of epitaxial structures 1, of the first portions 21 of the plurality of first electrode 2, so that the orthographic projection of the first electrode 2 on the first plane may be in the shape of a comb. This may help improve the current uniformity of the epitaxial structures 1 in the LED chip 100.

Of course, in the case where the first electrode 2 includes the plurality of first portions 21 and the plurality of second portions 22, the first electrode 2 may also surround the plurality of epitaxial structures 1. For example, two of the plurality of first portions 21 may be located on two opposite sides of a region defined by the plurality of epitaxial structures 1 as a whole, and remaining first portions 21 of the plurality of first portions 21 each may be located between two adjacent rows of epitaxial structures 1. The number of the second portions 22 may be two, and the two second portions 22 may be located on two opposite sides of the region defined by the plurality of epitaxial structures 1 as a whole. The two first portions 21 and the two second portions 22 may be connected end to end to surround the plurality of epitaxial structures 1. In a case where the number of the second portions 22 is greater than two, second portions 22 of the plurality of second portions 22 other than the two second portions 22 described above may be arranged between any two adjacent rows of the epitaxial structure 1. This may help further improve the current uniformity of the epitaxial structures 1 in the LED chip 100.

In some examples, as shown in FIGS. 1, 6, 8 and 9, the second electrodes 3 electrically connected to the second semiconductor patterns 13 may be arranged in an array.

For example, in the case where the second electrodes 3 are electrically connected to the second semiconductor patterns 13 in one-to-one correspondence, the orthographic projection of each second electrode 3 on the first plane may be in the same or approximately the same shape as the orthographic projection of the second semiconductor pattern electrically connected thereto on the first plane.

For another example, in the case where the second electrode 3 is electrically connected to the second semiconductor patterns 13, the orthographic projection of the second electrode 3 on the first plane may be in the same shape as a pattern formed by connecting the orthographic projections of the second electrodes 3 on the first plane in the above example.

In this example, the orthographic projection of the second semiconductor pattern 13 on the first plane may at least partially overlap with the orthographic projection of the second electrode 3 electrically connected to the second semiconductor pattern 13 on the first plane.

This may help ensure a relative large contact area between the second semiconductor pattern 13 and the second electrode 3 electrically connected to the second semiconductor pattern 13, and thus ensure a good electrical contact between the two and improve electrical properties of the LED chip 100.

In some embodiments, among the plurality of epitaxial structures 1 included in the LED chip 100, the gap between any two adjacent epitaxial structures 1 may be designed according to the specific structure of the epitaxial structure 1.

In some examples, as shown in FIGS. 4, 5 and 11, in the case where the plurality of light-emitting patterns 12 in the plurality of epitaxial structures 1 are connected to each other to form the light-emitting layer 12a, the gap between any two adjacent epitaxial structures 1 is the gap between the second semiconductor patterns 13 in the any two adjacent epitaxial structures 1.

For example, as shown in FIGS. 4, 5 and 11, in a case where the orthographic projection of the epitaxial structure 1 in an LED chip 100 on the first plane is in the shape of the bar, and the orthographic projection of the epitaxial structure 1 in an LED chip 100 on the first plane is in the shape of the polygon, the manufacturing processes of the two types of LED chips 100 (for example, reference may be made to schematic descriptions below) may be the same or approximately the same. In this case, the dimension of the gap between any two adjacent epitaxial structures 1 in each type of LED chip 100 may range from 0.01 μm to 100 μm.

For example, the dimension of the gap between any two adjacent epitaxial structures 1 in each type of LED chip 100 may be 0.01 μm (i.e., 10 nm), 0.1 μm (i.e., 100 nm), 1 μm (i.e., 1,000 nm), 10 μm, 50 μm, or 100 μm, etc.

Here, a dimension of the LED chip 100 (for example, a dimension thereof in the first direction X, a dimension thereof in the second direction Y, or a dimension of a diagonal thereof in a case where an overall shape of the LED chip 100 is rectangular) may be set according to actual needs.

For example, the dimension of the LED chip 100 may range from 100 μm to 500 μm. According to the dimension of the gap between every two adjacent epitaxial structures 1 in the LED chip 100, 50 to 500 epitaxial structures 1 may be provided in the LED chip 100.

It will be noted that in the related art, after the plurality of LEDs are transferred to the display backplane of the LED display device through the mass transfer technology, due to limitations of the mass transfer technology, the distance between any two adjacent LEDs in the plurality of LEDs may be in the order of microns (for example, 80 μm to 1,000 μm). The distance is relatively large, which easily prohibits the LED display device from achieving a higher pixel density (pixels per inch, which is abbreviated as PPI).

In the embodiments of the present disclosure, by setting the dimension of the gap between any two adjacent epitaxial structures 1 to the above range (in comparison, the distance between two adjacent LEDs is relatively small in the related art), it may be possible to make the dimension of the gap reach the order of nanometers, so that there is a relatively small distance between two adjacent light-emitting regions. In a case where the LED chip 100 is applied to an LED display device, more LED chips 100 may be arranged in a limited area. As a result, there are more epitaxial structures 1 (or light-emitting regions) in the limited area, which may help enable the LED display device to achieve a higher PPI. Moreover, application of the LED chip on 3D display may also be realized.

For example, as shown in FIGS. 3 to 5 and 11, an insulating material (for example, the first insulating layer 101 as shown in the figures) may be provided in the gap between any two adjacent epitaxial structures 1. In this way, the insulating material may be used to insulate between any two adjacent epitaxial structures 1, between any two adjacent second electrodes 3, and between the first electrode 2 and the second electrode 3.

Figure 7:
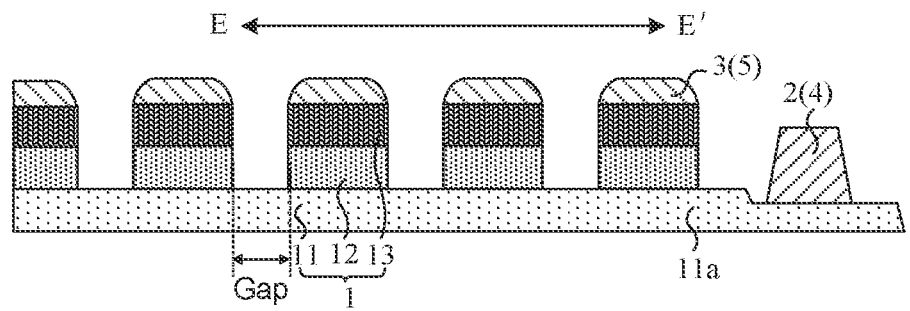
FIG. 7 is a sectional view of the LED chip shown in FIG. 6 taken along the E-E' direction.

For example, as shown in FIGS. 6 and 7, in the case where the orthographic projection of the epitaxial structure 1 in the LED chip 100 on the first plane is in the shape of the circle or the ellipse, the dimension of the gap between any two adjacent epitaxial structures 1 may range from 0.01 μm to 10 μm.

For example, the dimension of the gap between any two adjacent epitaxial structures 1 in each type of LED chip 100 may be 0.01 μm (i.e., 10 nm), 0.1 μm (i.e., 100 nm), 1 μm (i.e., 1,000 nm), 5 μm, or 10 μm, etc.

Based on the manufacturing process of the LED chip 100 (for example, reference may be made to the schematic description below), the gap with a smaller size may be formed between any two adjacent epitaxial structures 1. In this way, in the case where the LED chip 100 is applied to an LED display device, more epitaxial structures 1 (or light-emitting regions) may be arranged in the limited area, which may help the LED display device achieve an even PPI.

In some other examples, as shown in FIG. 12, in the case where the plurality of light-emitting patterns 12 in the plurality of epitaxial structures 1 are arranged independently of each other at intervals, the gap between any two adjacent epitaxial structures 1 is the gap between the light-emitting patterns 12 in any two adjacent epitaxial structures 1.

Here, in a case where the orthographic projection of the epitaxial structure 1 on the first plane in these examples where the plurality of light-emitting patterns 12 in the plurality of epitaxial structures 1 are arranged independently of each other at intervals is in the same shape as the orthographic projection of the epitaxial structure 1 on the first plane in the above examples where the plurality of light-emitting patterns 12 in the plurality of epitaxial structures 1 are connected to each other to form the light-emitting layer 12a, the epitaxial structure 1 may be formed by the same manufacturing process in these example as in the above examples. In this case, a difference between these examples and the above examples lies in that, in these example, the second semiconductor patterns 13 and the light-emitting patterns 12 may be simultaneously formed in a single patterning process, while in the above examples, only the second semiconductor patterns 13 are formed in a single patterning process. In this way, the dimension of the gap between any two adjacent epitaxial structures 1 in these examples may be in the same or approximately the same range as the dimension of the gap between any two adjacent epitaxial structures 1 in the above examples.

As for description of the gap between any two adjacent epitaxial structures 1 in these examples, reference may be made to the schematic description in the above embodiments, and details are not repeated here.

In some embodiments, as shown in FIGS. 1 to 12, the LED chip 100 further includes at least one first conductive pin 4 and a plurality of second conductive pins 5.

In some examples, as shown in FIGS. 1 to 12, the at least one first conductive pin 4 is located on a side of the at least one first electrode 2 in the LED chip 100 away from the first semiconductor layer 11a, and is electrically connected to the at least one first electrode 2. The first conductive pin 4 may be, for example, in direct contact with a corresponding first electrode 2.

For example, the first conductive pin(s) 4 and the first electrode(s) 2 may be arranged in one-to-one correspondence. That is, one first conductive pin 4 is electrically connected to one first electrode 2. In this way, electrons may be transmitted respectively through the first conductive pin 4 to the first electrode 2 electrically connected thereto.

In some examples, as shown in FIGS. 1 to 12, each second conductive pin 5 is electrically connected to a single second electrode 5. The second conductive pin 5 may be, for example, in direct contact with the corresponding second electrode 3.

For example, the second conductive pins 5 and the second electrodes 3 may be arranged in one-to-one correspondence. That is, one second conductive pin 5 may be electrically connected to one second electrode 3. In this way, holes may be transmitted respectively through the second conductive pin 5 to the second electrode 3 electrically connected thereto.

For example, how the second conductive pins 5 are arranged is related to the orthographic projection of the epitaxial structure 1 on the first plane.

For example, as shown in FIGS. 6 to 12, in the case where the orthographic projection of the epitaxial structure 1 on the first plane is in the shape of the polygon, the circle, or the ellipse, the second electrode 3 may be used as the second conductive pin 5. This may help simplify the structure of the LED chip 100.

For another example, as shown in FIGS. 2 to 5, in the case where the orthographic projection of the epitaxial structure 1 on the first plane is in the shape of the quadrilateral or the bar, the second conductive pin 5 may be arranged in a same layer as the second electrode 3 and the two form a one-piece structure. For example, an orthographic projection of the second conductive pin 5 on the first plane may partially overlap with the orthographic projection of the first electrode 2 on the first plane (as shown in FIG. 3); or there may be no overlap (as shown in FIG. 2).

In this case, the plurality of second conductive pins 5 may be arranged at a same end of a region defined by the plurality of second electrodes 3.

Of course, one part of the plurality of second conductive pins 5 may be arranged at one end of the region defined by the plurality of second electrodes 3, and the other part of the plurality of second conductive pins 5 may be arranged at an opposite end of the region defined by the plurality of second electrodes 3. The plurality of second conductive pins 5 may be arranged in a staggered manner (as shown in FIGS. 2 and 3). That is, every two adjacent second conductive pins 5 are arranged at two opposite ends of a region defined by the two second electrodes 3. This may help increase a distance between two adjacent second conductive pins 5. Therefore, in a case where the LED chip 100 is applied to an LED display device, a transfer accuracy may be effectively reduced.

It will be noted that, the phrase "arranged in same layer" mentioned herein refers to a practice of forming a film layer for forming specific patterns through a same film forming process and then forming a layer structure through a single patterning process by using a same mask. Depending on the different specific patterns, the single patterning process may include several exposure, development or etching processes: the specific patterns in the formed layer structure may be continuous or discontinuous, and these specific patterns may be at different heights or have different thicknesses. In this way, the second conductive pins 5 and the second electrodes 3 may be formed simultaneously in a single patterning process, which may help simplify the manufacturing process of the LED chip 100.

In some embodiments, as shown in FIGS. 11 and 12, the LED chip 100 further includes an ohmic contact layer 6 provided between each second semiconductor pattern 13 and the second electrode 3 electrically connected to it (i.e., the second semiconductor pattern 13).

In some examples, the second semiconductor patterns 13 and the ohmic contact layers 6 are arranged in one-to-one correspondence, and the orthographic projection of the second semiconductor pattern 13 on the first semiconductor layer 11a coincides with or approximately coincides with an orthographic projection of the corresponding ohmic contact layer 6 on the first semiconductor layer 11a. In this way, the ohmic contact layer 4 may be used to effectively increase a mobility of carriers (for example, holes).

A material of the ohmic contact layer 6 may be various, which may be determined according to actual needs.

In some examples, the ohmic contact layer 6 is a transparent ohmic contact layer. In this case, the ohmic contact layer 6 may be made of, for example, indium tin oxide ITO), or other materials with a high light transmittance.

In some other examples, the ohmic contact layer 6 is a reflective ohmic contact layer. In this case, the ohmic contact layer 6 may be made of, for example, gold (Au), nickel (Ni), platinum (Pt), or the like. In this way, the ohmic contact layer 6 may be used to reflect light emitted from the light-emitting pattern 12 and incident onto the ohmic contact layer 6, thereby improving a light utilization rate of the LED chip 100.

In some embodiments, as shown in FIG. 12, the LED chip 100 further includes a buffer layer 7 provided on a side of the plurality of epitaxial structures 1. Here, the side of the epitaxial structure 1 refers to a side of the first semiconductor layer 11a away from the second semiconductor pattern 13.

By providing the buffer layer 7, it may help ensure that the first semiconductor layer 11a have good crystal quality.

A material of the buffer layer 7 may be various. For example, the buffer layer 7 may be made of GaN.

It is worth mentioning that a type of a structure of the LED chip 100 may be various, which may be determined according to actual needs. For example, the LED chip 100 may be of a front-mounted structure, a vertical structure, or a flip-chip structure.

In some embodiments, as shown in FIGS. 1 to 12, the first electrode(s) 2 and the plurality of second electrodes 3 may be arranged on a same side of the first semiconductor layer 11a.

In some examples, "the same side of the first semiconductor layer 11a" means that the first electrode 2 may be disposed on a side of the first semiconductor layer 11a proximate to the light-emitting pattern 12, and the second electrode 3 may be disposed on a side of the second semiconductor pattern 13 away from the light-emitting pattern 12.

Based on this, the LED chip 100 may be referred to as an LED chip with a flip-chip structure. In this case, the LED chip 100 may be directly electrically connected to the backplane in the LED display device through the first electrode 2 and the second electrode 3 without additional wiring, which may help simplify the structure of the LED display device to which the LED chip 100 is applied.

Some embodiments of the present disclosure provide a method for manufacturing an LED chip. The method may include steps 100 to 400 (S100~S400).

In S100, a substrate 8 is provided.

There are various types of the substrates 8. For example, the substrate 8 is a GaP substrate, a GaAs substrate, a silicon substrate, a silicon carbide substrate, or a sapphire substrate.

It will be noted that the type of the substrate 8 may be determined according to the materials of the first semiconductor pattern 11 and the second semiconductor pattern 13 to be formed.

For example, in a case where the intrinsic semiconductor in the first semiconductor pattern 11 and the second semiconductor pattern 13 is GaP, AlGaAs, or AlGaInP, the substrate 8 may be the GaP substrate or the GaAs substrate. In a case where the intrinsic semiconductor in the first semiconductor pattern 11 and the second semiconductor pattern 13 is GaN, the substrate 8 may be the silicon carbide substrate or the sapphire substrate.

In S200, a plurality of epitaxial structures 1 are formed on a side of the substrate 8. A gap exists between any two adjacent epitaxial structures 1 in the plurality of epitaxial structures 1. Each epitaxial structure 1 includes a first semiconductor pattern 11, a light-emitting pattern 12 and a second semiconductor pattern 13 stacked in sequence. The first semiconductor patterns 11 in at least two of the plurality of epitaxial structures 1 are connected to each other to form a first semiconductor layer 11a.

Here, there are various methods for forming the plurality of epitaxial structures 1 on the side of the substrate 8, which may be selected according to actual needs. The method for forming the plurality of epitaxial structures 1 is schematically described below. Of course, the methods for forming the plurality of epitaxial structures 1 are not limited to the three methods exemplified below.

In some examples, the step of forming a plurality of epitaxial structures 1 on a side of the substrate 8 (S200 above) includes step 210a to 220a (S210a to S220a).

Figure 13A:
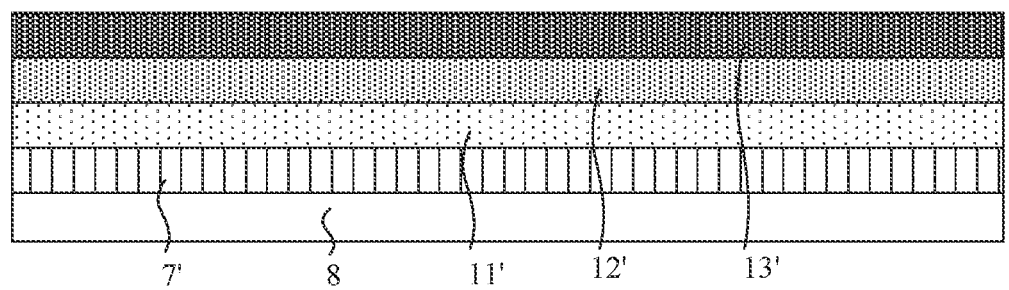
FIGS. 13(a) to 13(g) are flowcharts of a method for manufacturing a LED chip, in accordance with some embodiments of the present disclosure.
Figure 13B:
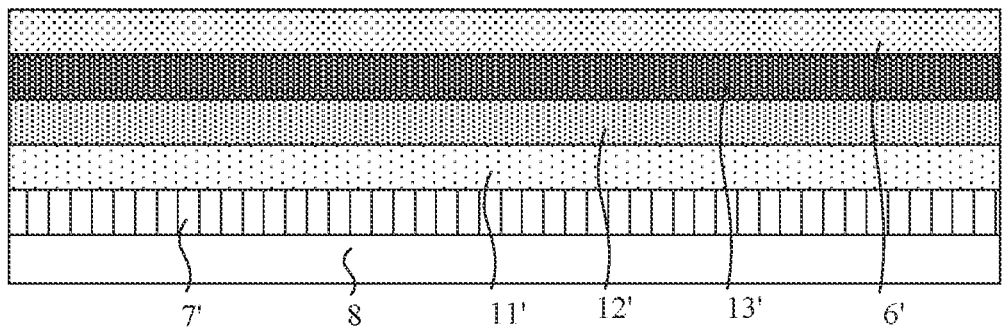

In S210a, as shown in FIG. 13(a), a first semiconductor film 11', a light-emitting film 12', and a second semiconductor film 13' are formed on the side of the substrate 8 in sequence.

For example, a metalorganic vapor phase epitaxy (MOCVD) process may be used to sequentially epitaxially grow the first semiconductor film 11', the light-emitting film 12' and the second semiconductor film 13' on the side of the substrate 8.

Here, as for the materials of the first semiconductor film 11', the light-emitting film 12' and the second semiconductor film 13', reference may be made to the description of the materials of the first semiconductor pattern 11, the light-emitting pattern 12 and the second semiconductor pattern 13 in some of the above embodiments, and details will not be repeated here.

Figure 13C:
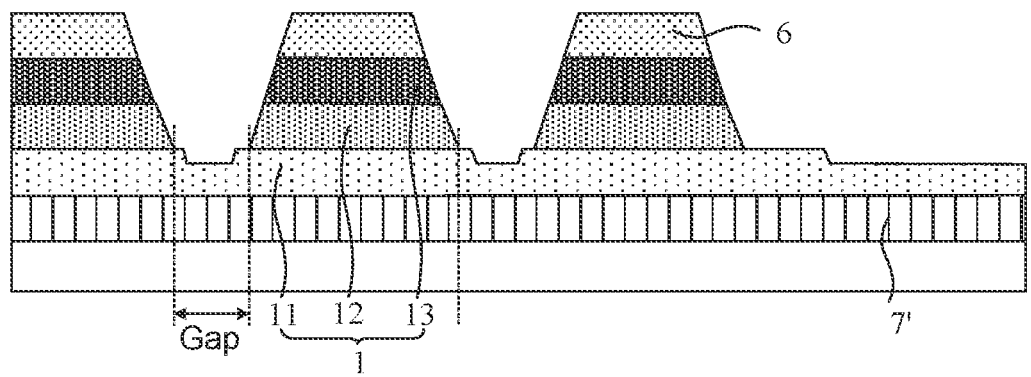
Figure 13D:
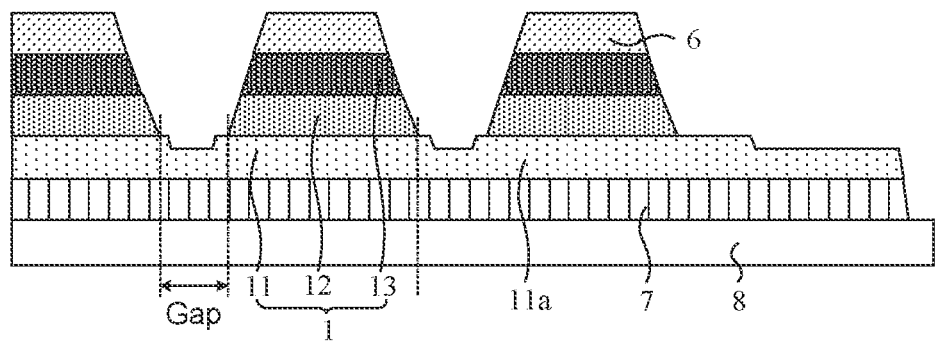

In S220a, as shown in FIG. 13(c), the second semiconductor film 13', the light-emitting film 12' and the first semiconductor film 11' are patterned to form first semiconductor patterns 11, light-emitting patterns 12 and second semiconductor patterns 13, so as to obtain the plurality of epitaxial structures 1. At least two first semiconductor patterns 11 are connected to each other to form the first semiconductor layer 11a.

For example, a photolithography process may be used to pattern the second semiconductor film 13', the light-emitting film 12' and the first semiconductor film 11'.

Here, in the process of patterning the second semiconductor film 13', the light-emitting film 12' and the first semiconductor film 11', an etching depth may be greater than or equal to a thickness of the second semiconductor film 13' (that is, a dimension thereof in a direction perpendicular to the substrate 8), and may be less than a sum of thicknesses of the second semiconductor film 13', the light-emitting film 12', and the first semiconductor film 11'.

In a case where the etching depth is greater than or equal to the thickness of the second semiconductor film 13' and less than a sum of thicknesses of the second semiconductor film 13' and the light-emitting film 12', a plurality of second semiconductor patterns 13 that are arranged independently of each other at intervals may be formed first.

In this case, edge portions of the patterned light-emitting film 12' may be further patterned (for example, by a photolithography process) to expose the patterned first semiconductor film 11'. In this case, a light-emitting layer 12a (in which the plurality of light-emitting patterns 12 in the plurality of epitaxial structures 1 are all connected to each other) and the first semiconductor layer 11a (in which the plurality of first semiconductor patterns 11 in the plurality of epitaxial structures 1 are all connected to each other) are obtained.

Of course, while the edge portions of the patterned light-emitting film is further patterned, portions of the patterned light-emitting film located in the gaps between any two adjacent second semiconductor patterns 13 may be etched simultaneously to obtain a plurality of light-emitting layers 12a.

It will be noted that, in the process of further patterning the edge portions of the patterned light-emitting film or further patterning the edge portions of the patterned light-emitting film and the portions of the patterned light-emitting film located in the gaps between any two adjacent second semiconductor patterns 13, the etching depth may be the thickness of the light-emitting film 12', so that only a surface of the patterned first semiconductor film 11' is exposed; or, the etching depth may be greater than the thickness of the light-emitting film 12' and less than the sum of the thicknesses of the light-emitting film 12' and the first semiconductor film 11', so that a part of the patterned first semiconductor film 11' is etched away. This may facilitate the formation of good electrical connection between the first electrode 2 (which will be subsequently formed) and the first semiconductor layer 11a.

For another example, as shown in FIG. 13(c), in a case where the etching depth is greater than or equal to the sum of the thicknesses of the second semiconductor film 13' and the light-emitting film 12', and is less than the sum of the thicknesses of the second semiconductor film 13', the light-emitting film 12' and the first semiconductor film 11', the surface of the first semiconductor film may be exposed and a plurality of second semiconductor patterns 13, a plurality of light-emitting patterns 12 and a first semiconductor layer 11a (for example, a plurality of first semiconductor patterns 11 in the plurality of epitaxial structures 1 are all connected to each other) may be formed.

For example, shapes of the obtained plurality of epitaxial structures 1 may be various, and arrangement manners of the obtained plurality of epitaxial structures 1 may be various, which may be determined according to actual needs.

For example, the plurality of epitaxial structures 1 may be arranged at intervals along the first direction X, and each epitaxial structure 1 extends along the second direction Y. An orthographic projection of each epitaxial structure 1 on the first plane may be in a shape of a rectangle or a bar.

For another example, the plurality of epitaxial structures 1 may be arranged in an array. The orthographic projection of each epitaxial structure 1 on the first plane may be in a shape of a polygon (for example, a triangle, a rectangle, or a hexagon).

Here, as for the shapes of the second semiconductor pattern 13 and the light-emitting pattern 12 in the epitaxial structure 1, reference may be made to the schematic description in some of the above embodiments.

It will be noted that, considering an influence of the manufacturing process, an angle between an edge of the formed epitaxial structure 1 and the first plane may be, for example, an acute angle, as shown in FIG. 13(c), so that a cross section of the epitaxial structure 1 is in a shape of a trapezoid.

In some other examples, the step of forming a plurality of epitaxial structures 1 on a side of the substrate (S200 above) includes steps 210b to 240b (S210b to S240b).

In S210b, as shown in FIG. 13(a), a first semiconductor film 11', a light-emitting film 12' and a second semiconductor film 13' are formed on the side of the substrate 8 in sequence.

For example, as for the manufacturing process and materials of the first semiconductor film 11', the light-emitting film 12' and the second semiconductor film 13', reference may be made to the schematic description in S210a above, and details will not be repeated here.

Figure 14A:
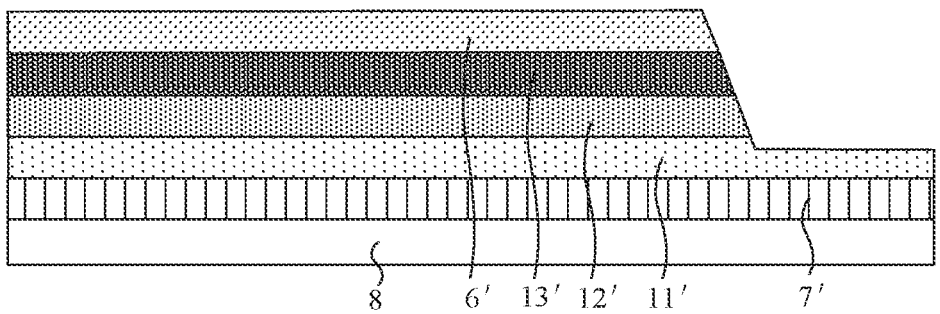
FIGS. 14(a) to 14(g) are flowcharts of another method for manufacturing a LED chip, in accordance with some embodiments of the present disclosure.
Figure 14B:
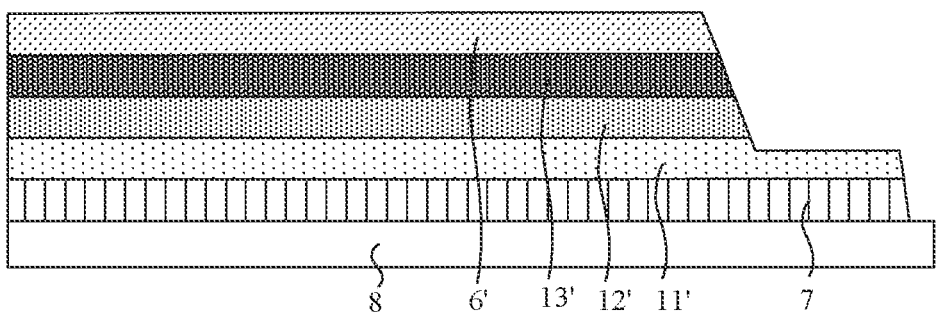
Figure 14C:
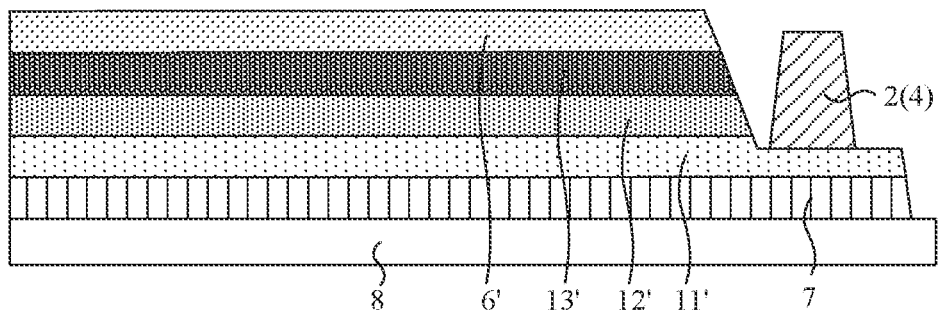
Figure 14D:
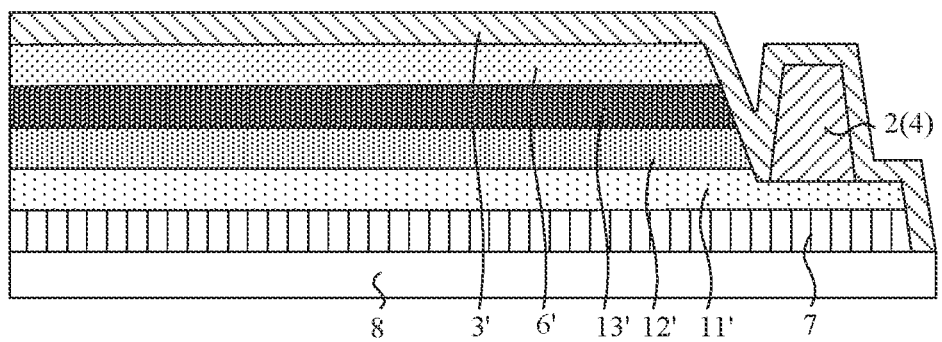
Figure 14E:
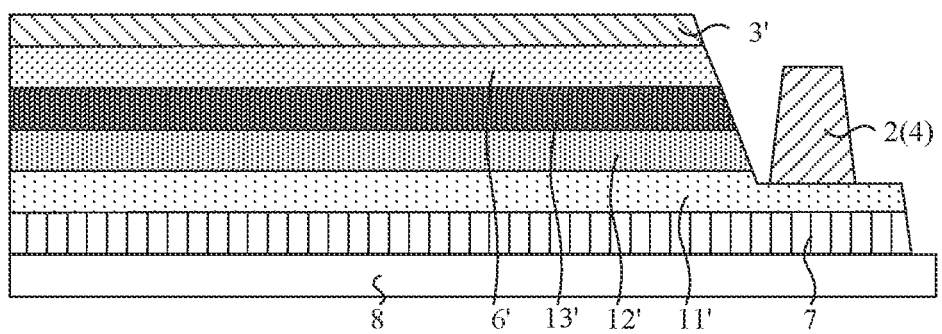

In S220b, as shown in FIGS. 14(d) and 14(e), a conductive film 3' is formed on a side of the second semiconductor film 13' away from the substrate 8.

For example, a sputtering process may be used to form the conductive film 3'.

For example, the conductive film 3' may be made of nickel (Ni), silver (Ag), aluminum (Al), or the like. A thickness of the conductive film 3' may range from 1 nm to 1,000 nm.

For example, the thickness of the conductive film 3' may be 1 nm, 10 nm, 150 nm, 500 nm, 800 nm, or 1,000 nm.

Figure 14F:
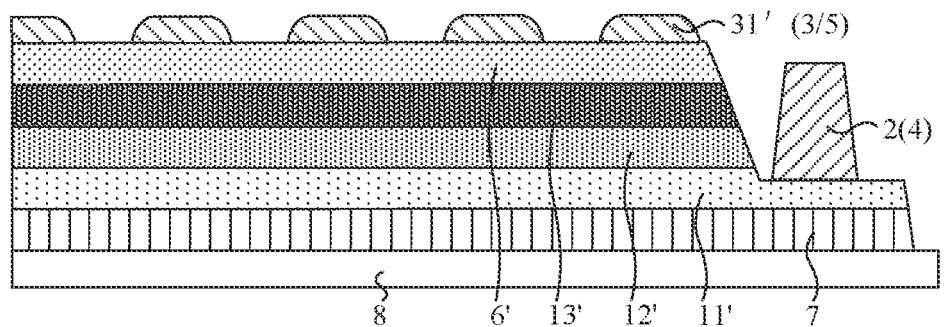

In S230b, as shown in FIG. 14(f), the conductive film 3' is annealed to form a plurality of conductive particles 31' that are dispersed.

For example, a temperature of the annealing treatment may range from 100° C. to 500° C., and a duration of the annealing treatment may range from 10 s to 1,000 s.

For example, the temperature of the annealing treatment may be 100° C., 200° C., 300° C., 410° C., or 500° C., and the duration of the annealing treatment may be 10 s, 100 s, 300 s, 550 s, 860 s, or 1,000 s.

In the annealing treatment of the conductive film 3', a principle of solid dehumidification may be applied to make the conductive film 3' become the plurality of conductive particles 31'. The plurality of conductive particles 31' may be evenly dispersed, and a diameter of the conductive particles may be relatively uniform.

It will be noted that, as the temperature of the annealing treatment increases, the diameter of the conductive particles 31' may increase accordingly. Therefore, the diameter of the conductive particles 31' may be controlled by controlling the temperature of the annealing treatment, so as to obtain a required particle size.

For example, the diameter of the conductive particles 31' may range from 0.01 μm to 10 μm, and a dimension of a gap between adjacent conductive particles 31' may range from 0.01 μm to 10 μm.

For example, the diameter of the conductive particles 31' may be 0.01 μm, 0.1 μm, 1 μm, 5 μm, or 10 μm. The dimension of the gap between adjacent conductive particles 31' may be 0.01 μm, 0.1 μm, 1 μm, 5 μm, or 10 μm.

Figure 14G:
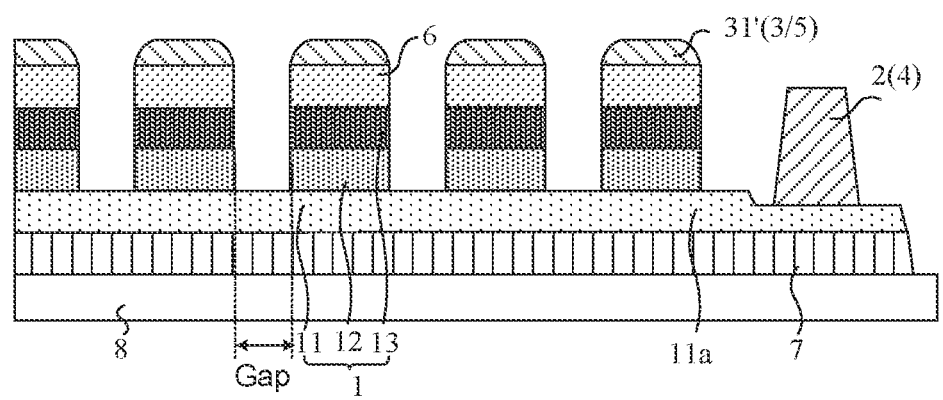

In S240b, as shown in FIG. 14(g), the plurality of conductive particles 31' are used as a mask to pattern the second semiconductor film 13', the light-emitting film 12' and the first semiconductor film 11' to form first semiconductor patterns 11, light-emitting patterns 12 and second semiconductor patterns 13, so as to obtain the plurality of epitaxial structures 1. At least two first semiconductor patterns 11 are connected to each other to form the first semiconductor layer 11a.

For example, as for the patterning process or etching depth of the second semiconductor film 13', the light-emitting film 12' and the first semiconductor film 11', reference may be made to the schematic description in S220a above, and details will not be repeated here.

For example, shapes of the obtained plurality of epitaxial structures 1 may be various, and arrangement manners of the obtained plurality of epitaxial structures 1 may be various, which may be determined according to actual needs.

For example, the plurality of epitaxial structures 1 may be arranged in an array. The orthographic projection of each epitaxial structure 1 on the first plane may be in a shape of a circle or an ellipse.

Here, as for the shapes of the second semiconductor pattern 13 and the light-emitting pattern 12 in the epitaxial structure 1, reference may be made to the schematic description in some of the above embodiments.

Considering the manufacturing process of the epitaxial structure 1, the diameter of the conductive particles 31', and the dimension of the gap between adjacent conductive particles 31', the angle between the edge of the formed epitaxial structure 1 and the first plane may be, for example, 90° or approximate 90°, as shown in FIG. 14(g), so that the cross section of the epitaxial structure 1 is in a shape of a rectangle.

It will be noted that, after the patterning of the second semiconductor film 13', the light-emitting film 12', and the first semiconductor film 11' is completed, the plurality of conductive particles 31' may be used as a plurality of second electrodes 3.

In still some other examples, the step of forming a plurality of epitaxial structures 1 on a side of the substrate (S200 above) may include steps 210c to 230c (S210c to S230c).

Figure 15A:
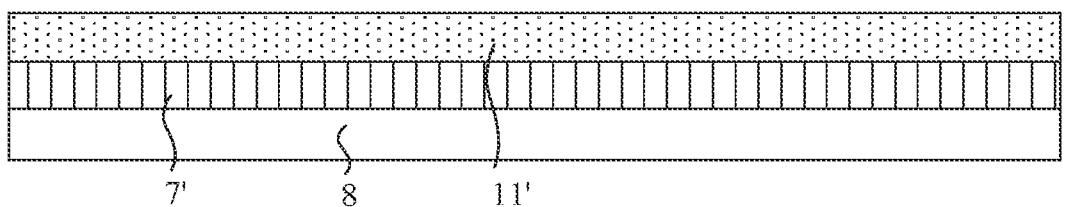
FIGS. 15(a) to 15(i) are flowcharts of yet another method for manufacturing a LED chip, in accordance with some embodiments of the present disclosure.

In S210c, as shown in FIG. 15(a), a first semiconductor film 11' is formed on the substrate 8. Or, as shown in FIG.

16(a), a first semiconductor film 11' and a light-emitting film 12' are formed on the substrate 8 in a stacked manner.

For example, as for the manufacturing process and materials of both the first semiconductor film 11' and the light-emitting film 12', reference may be made to the schematic description in S210a above, and details will not be repeated here.

In these examples, the first semiconductor film 11' may be referred to as the first semiconductor layer 11a. The first semiconductor layer 11a includes a plurality of first semiconductor patterns 11 in the plurality of epitaxial structures 1 to be formed.

Figure 15B:
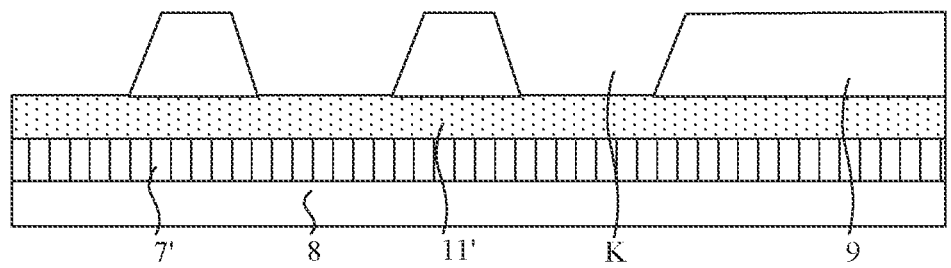
Figure 16A:
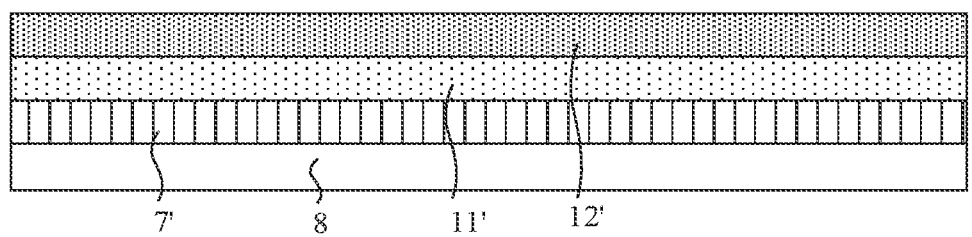
FIGS. 16(a) to 16(g) are flowcharts of yet another method for manufacturing a LED chip, in accordance with some embodiments of the present disclosure.
Figure 16B:
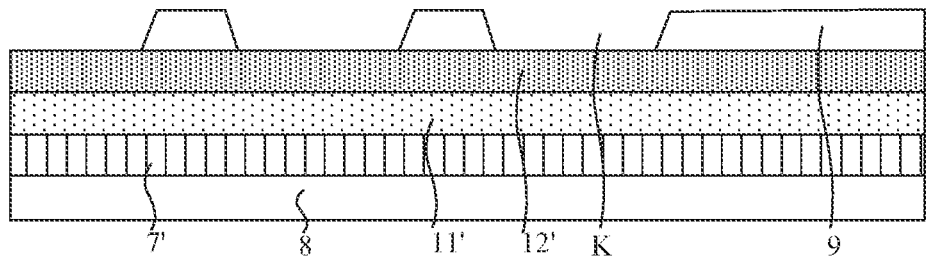

In S220c, as shown in FIGS. 15(b) and 16(b), a defining layer 9 is formed on the substrate 1. The defining layer 9 has a plurality of openings K. The defining layer 9 is configured to define the epitaxial structures 1.

Here, in a case where only the first semiconductor film 11' is formed on the substrate 8, the defining layer 9 may be located on a side of the first semiconductor film 11' away from the substrate 8, and the plurality of openings K expose the first semiconductor film 11'. In a case where both the first semiconductor film 11' and the light-emitting film 12' are formed on the substrate 8, the defining layer 9 may be located on a side of the light-emitting film 12' away from the substrate 8, and the plurality of openings K expose the light-emitting film 12'.

For example, a deposition process may be used to form a defining film, and then a photolithography process may be used to pattern the defining film to form the plurality of openings K, so as to obtain the defining layer 9.

For example, the defining film may be of a structure consisting of a single layer of film made of silicon dioxide (SiO2), silicon nitride (SiN) or silicon oxynitride (SiON), or may be of a structure consisting of multiple layers of films made of at least two of SiO2, SiN and SiON, which are sequentially stacked together.

It will be noted that, considering the influence of the manufacturing process, an angle between an edge of the opening K of the formed defining layer 9 and the first plane may be, for example, an acute angle, as shown in FIGS. 15(b) and 16(b), so that a cross section of the epitaxial structure 1 is in a shape of a trapezoid.

Figure 15C:
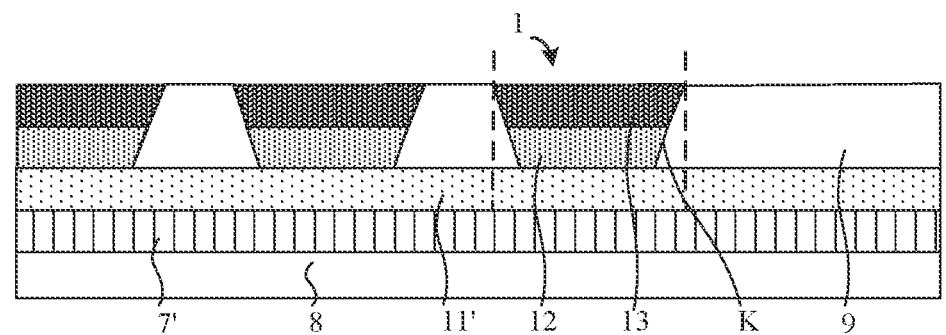
Figure 15D:
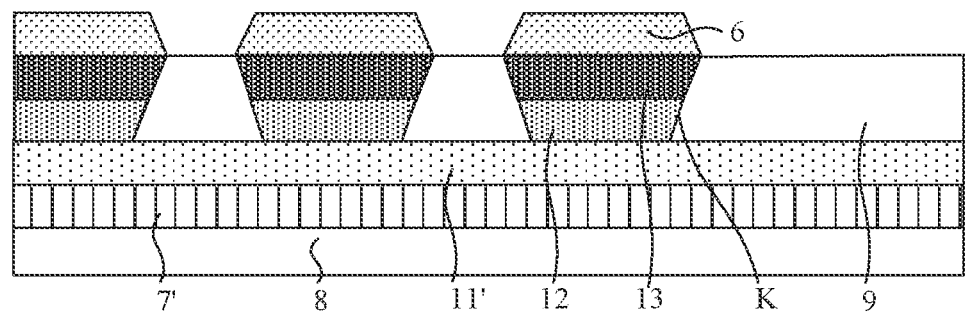
Figure 16C:
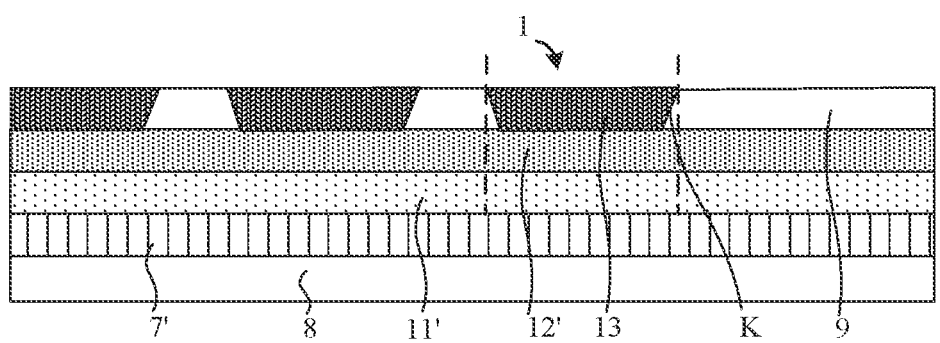
Figure 16D:
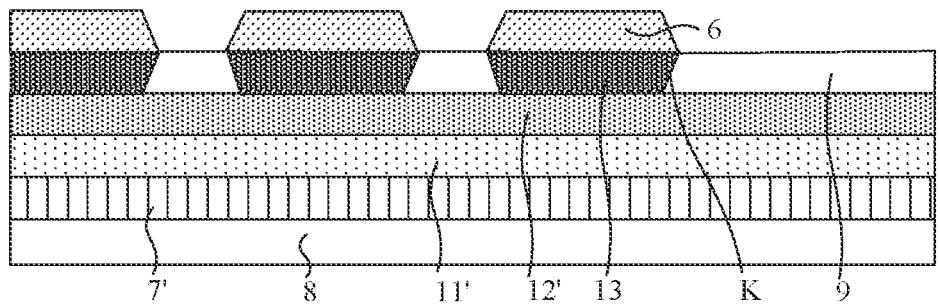

In S230c, as shown in FIG. 15(c), a light-emitting pattern 12 and a second semiconductor pattern 13 are formed in each opening K in a stacked manner in a case where the first semiconductor film 11' is formed on the substrate 8. Or, as shown in FIG. 16(c), a second semiconductor pattern 13 is formed in each opening K in a case where the first semiconductor film 11' and the light-emitting film 12' are formed on the substrate 8. In this step, the plurality of epitaxial structures 1 are obtained.

For example, the light-emitting pattern 12 and the second semiconductor pattern 13 may be formed in the openings K by using the MOCVD process, the shapes of the cross sections of the light-emitting pattern 12 and the second semiconductor pattern 13 being determined by the shape of the opening K; or, only the second semiconductor pattern 13 is formed in the openings K, the shape of the cross section of the second semiconductor pattern 13 being determined by the shape of the opening K.

Here, after the defining layer 9 is formed, the arrangement, shape and size of the epitaxial structure 1 may be limited by the openings K in the defining layer 9.

For example, shapes of the obtained plurality of epitaxial structures 1 may be various, and arrangement manners of the obtained plurality of epitaxial structures 1 may be various, which may be determined according to actual needs.

For example, the plurality of epitaxial structures 1 may be arranged at intervals along the first direction X, and each epitaxial structure 1 extends along the second direction Y. An orthographic projection of each epitaxial structure 1 on the first plane may be in a shape of a quadrilateral or a bar.

For another example, the plurality of epitaxial structures 1 may be arranged in an array. The orthographic projection of each epitaxial structure 1 on the first plane may be in a shape of a polygon (for example, a triangle, a rectangle, or a hexagon).

Here, as for the shapes of the second semiconductor pattern 13 and the light-emitting pattern 12 in the epitaxial structure 1, reference may be made to the schematic description in some of the above embodiments.

It will be noted that in the case where the light-emitting pattern 12 and the second semiconductor pattern 13 are formed in each opening K in the stacked manner, a thickness of the defining layer 9 may be set to be, for example, equal to or approximately equal to a sum of thicknesses of the light-emitting pattern 12 and the second semiconductor pattern 13, so that the light-emitting pattern 12 and the second semiconductor pattern 13 are formed only in the openings K. In the case where only the second semiconductor pattern 13 is formed in each opening K, the thickness of the defining layer 9 may be set to be, for example, equal to or approximately equal to the thickness of the second semiconductor pattern 13, so that the second semiconductor pattern 13 is formed only in the openings K1.

By providing the defining layer 9, it may be possible to avoid forming the light-emitting pattern 12 and the second semiconductor pattern 13 by using the patterning process, or avoid forming the second semiconductor pattern 13 by using the patterning process. This may help simplify the manufacturing process of the LED chip 100, and prevent the patterning process from damaging the subsequently formed structure (that is, the light-emitting pattern 12 and the second semiconductor pattern 13, or the second semiconductor pattern 13) and affecting a light-emitting performance of the LED chip.

In S300, at least one first electrode 2 is formed. The first electrode 2 is electrically connected to the first semiconductor layer 11a.

For example, the first electrode 2 may be formed by a photolithography process. The first electrode 2 may be made of titanium (Ti), aluminum (Al), Ni, or Au, etc.

Figure 13G:
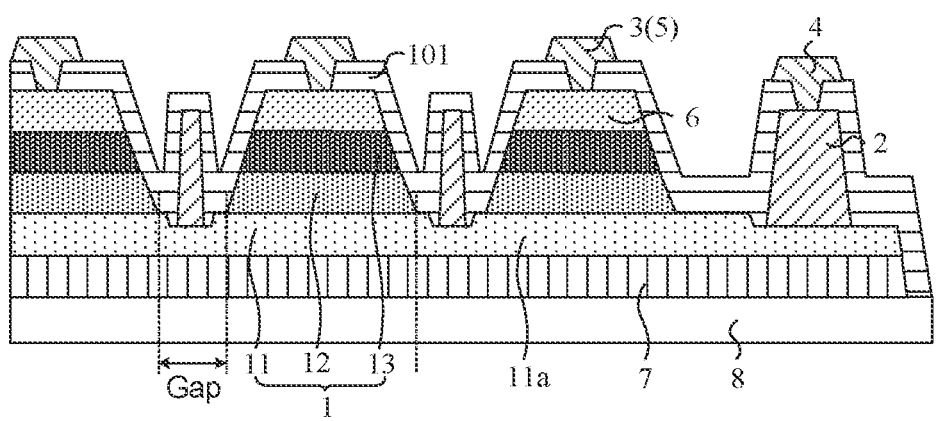
Figure 15E:
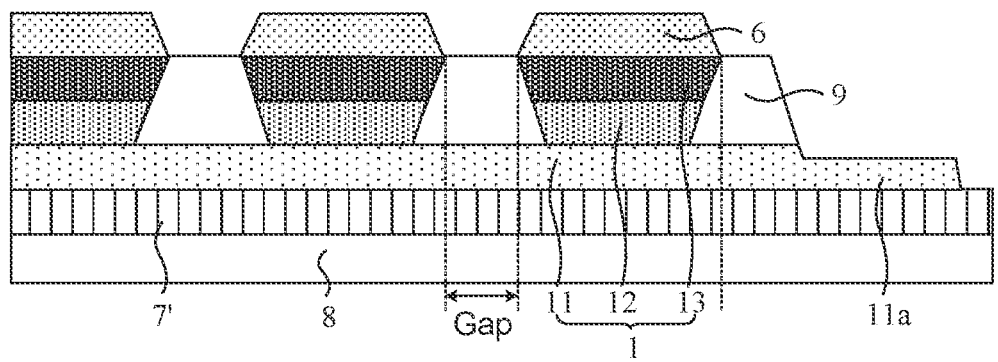
Figure 15F:
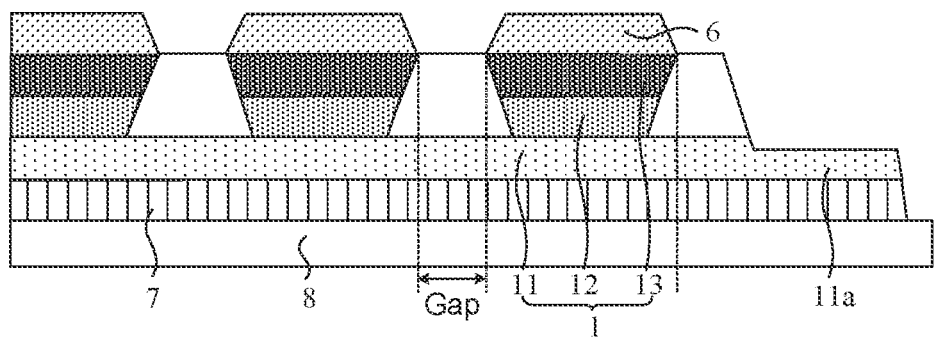
Figure 15G:
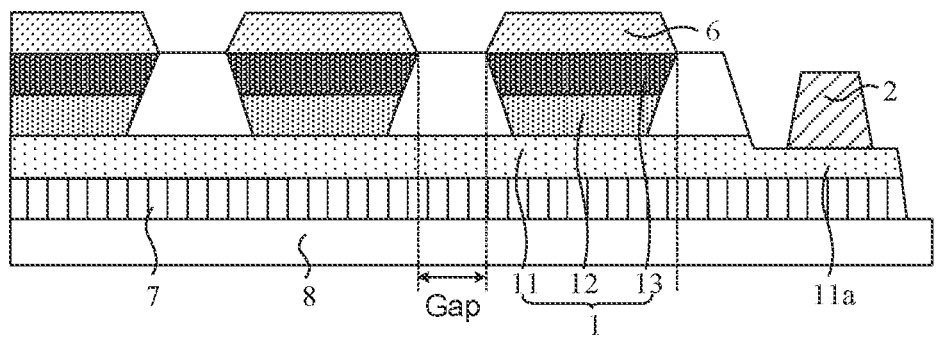
Figure 15H:
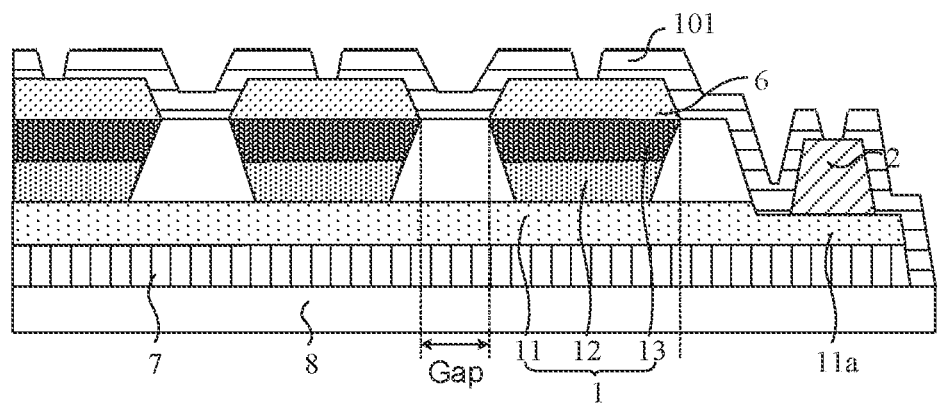
Figure 15I:
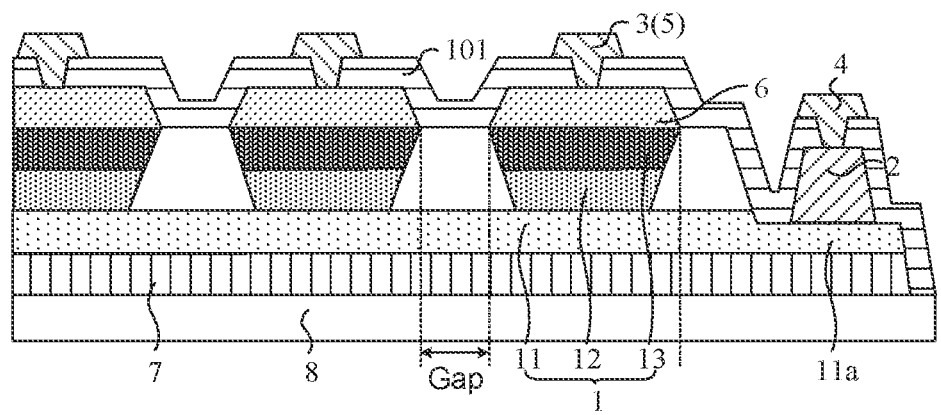
Figure 16E:
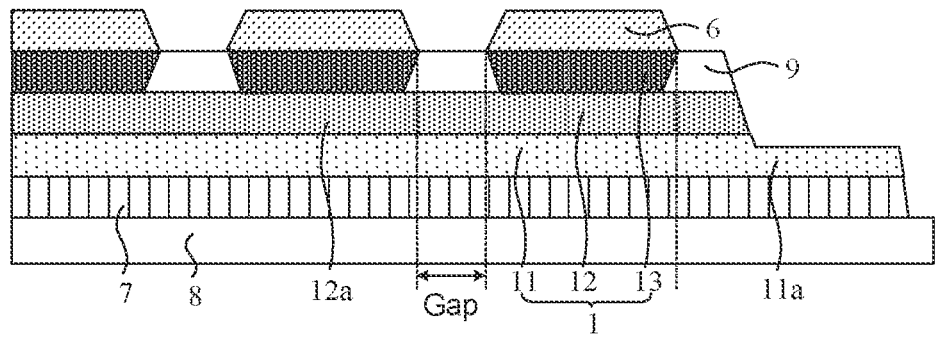
Figure 16F:
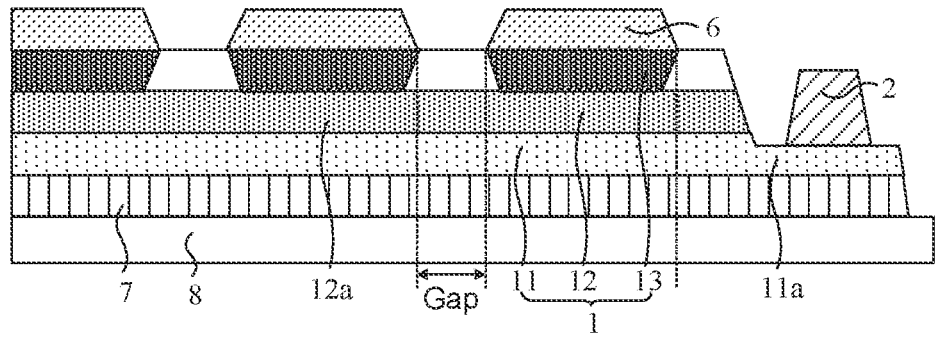
Figure 16G:
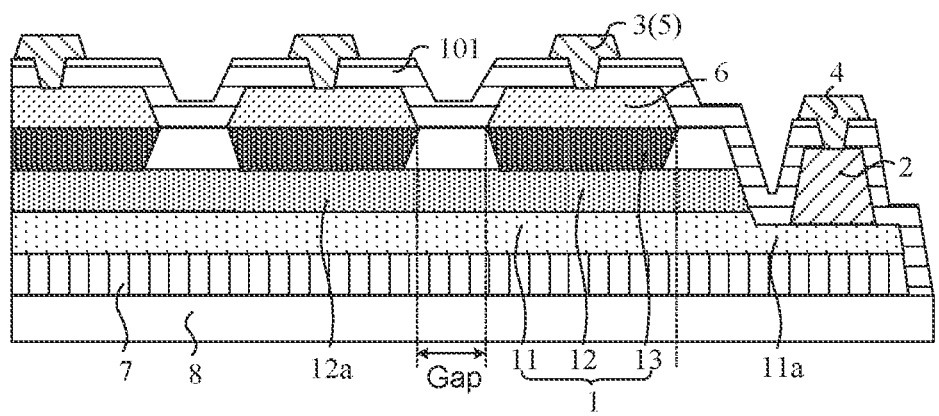
Figure 13A:
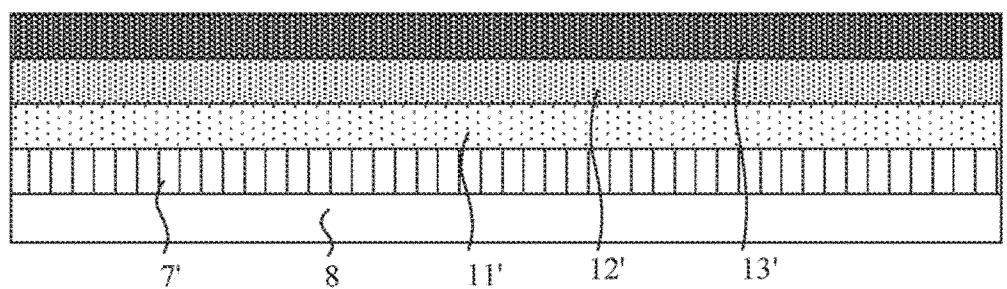
Figure 13B:
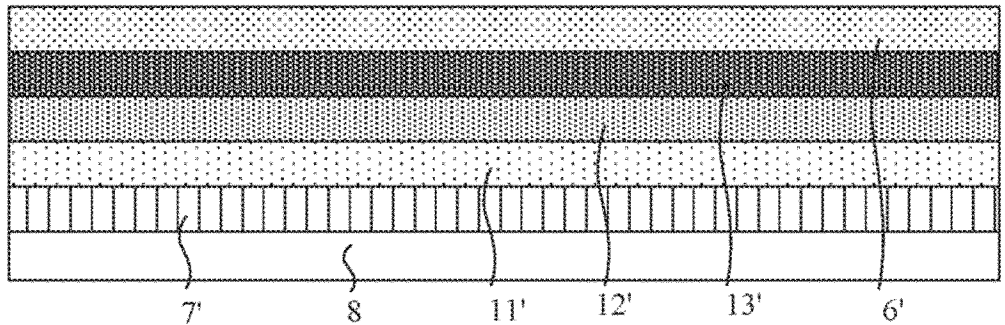
Figure 13C:
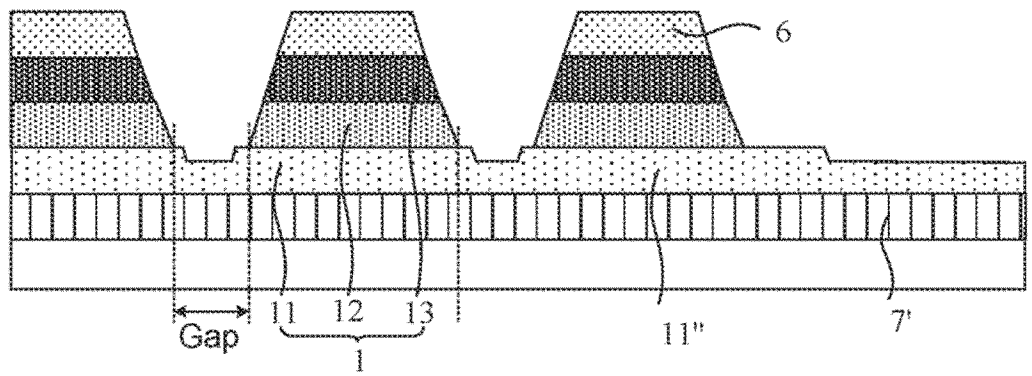
Figure 13D:
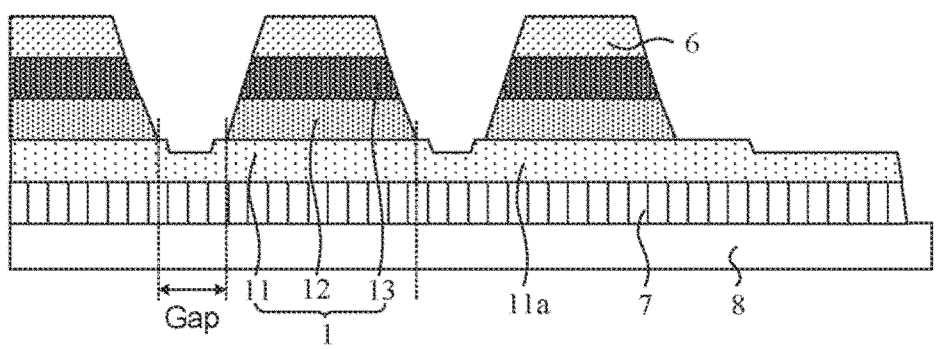
Figure 13E:
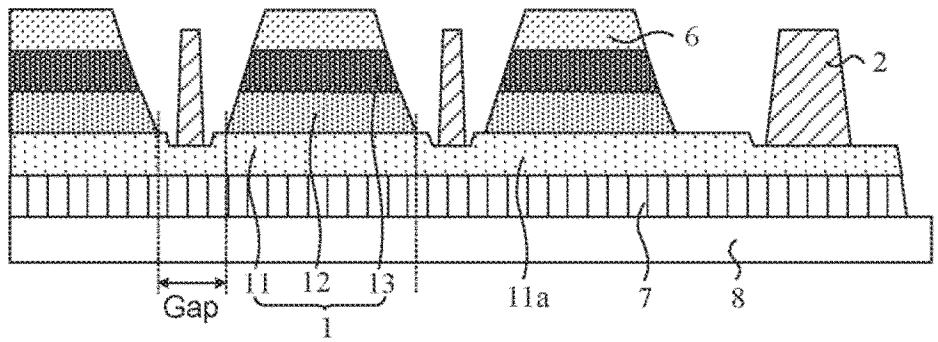

It will be noted that, considering an influence of the manufacturing process, an angle between an edge of the formed epitaxial structure 1 and the first plane may be set to be, for example, an acute angle, as shown in FIGS. 13(e), 15(g) and 16(f), so that the cross section of the epitaxial structure 1 is in the shape of the trapezoid.

Here, the first electrode 2 may be formed by various methods, which may be selected according to actual needs.

In some examples, after the plurality of epitaxial structures 1 are obtained in S210a to S220a, S300 may include step 310a (S310a).

In S310a, as shown in FIG. 13(e), a first electrode material film is formed on a side of the plurality of epitaxial structures 1 away from the substrate 8, and then a photolithography process is used to pattern the first electrode material film to obtain the first electrode(s) 2.

Here, as for a shape and arrangement of the first electrode 2, reference may be made to the descriptions in some of the above examples, and details will not be repeated here.

In some other examples, before the conductive film 3' is formed in S220b, and after the first semiconductor film 11', the light-emitting film 12' and the second semiconductor film 13' are formed in S210b, S300 may include steps 310b to 320b (S310b to S320b).

In S310b, as shown in FIG. 14(a), the second semiconductor film 13', the light-emitting film 12' and the first semiconductor film 11' are patterned to expose a surface of a portion of the first semiconductor film 11' corresponding to the first electrode 2 to be formed.

For example, a photolithography process may be used to pattern the second semiconductor film 13', the light-emitting film 12' and the first semiconductor film 11'.

For example, the photolithography process may include: coating on a side of the second semiconductor film 13' away from the substrate 8 with a photoresist and patterning the photoresist, and using the patterned photoresist as a mask to pattern the second semiconductor film 13', the light-emitting film 12' and the first semiconductor film 11'; or, depositing silicon dioxide (SiO2) on a side of the second semiconductor film 13' away from the substrate 8, coating it with a photoresist, patterning the photoresist, using the patterned photoresist as a mask to pattern the SiO2, and then using the patterned SiO2 as a mask to pattern the second semiconductor film 13', the light-emitting film 12' and the first semiconductor film 11'.

Here, in a process of patterning the second semiconductor film 13', the light-emitting film 12' and the first semiconductor film 11', an etching depth may be greater than or equal to a sum of the thicknesses of the second semiconductor film 13' and the light-emitting film 12', and less than a sum of the thicknesses of the second semiconductor film 13', the light-emitting film 12' and the first semiconductor film 11'.

In S320b, as shown in FIG. 14(c), a first electrode material film is formed in the above structure obtained in S310b, and then the first electrode material film is patterned by a photolithography process to obtain the first electrode(s) 2.

As for a shape and arrangement of the first electrode 2, reference may be made to the descriptions in some of the above examples, and details will not be repeated here.

In still some other examples, after the plurality of epitaxial structures 1 are obtained in S210c to S230c, S300 may include steps 310c to 320c (S310c to S320c).

For example, as shown in FIG. 15(e), in the case where the first semiconductor film 11' is formed on the substrate 8 in S210c, S310c may include: patterning the defining layer 9 and the first semiconductor film 11' to expose the surface of the portion of the first semiconductor film 11' corresponding to the first electrode 2 to be formed.

For example, a photolithography process may be used to pattern the defining layer 9 and the first semiconductor film 11'.

Here, in the process of patterning the defining layer 9 and the first semiconductor film 11', an etching depth may be, for example, greater than or equal to the thickness of the defining layer 9, and less than a sum of the thicknesses of the defining layer 9 and the first semiconductor film 11'.

For another example, as shown in FIG. 16(e), in the case where the first semiconductor film 11' and the light-emitting film 12' are formed on the substrate 8 in S210c, S310c may include: patterning the definition layer 9, the light-emitting film 12' and the first semiconductor film 11' to expose the surface of the portion of the first semiconductor film 11' corresponding to the first electrode 2 to be formed.

For example, a photolithography process may be used to pattern the defining layer 9, the light-emitting film 12' and the first semiconductor film 11'.

Here, in a process of patterning the defining layer 9, the light-emitting film 12' and the first semiconductor film 11', an etching depth may be greater than or equal to a sum of the thicknesses of the defining layer 9 and the light-emitting film 12', and less than a sum of the thicknesses of the defining layer 9, the light-emitting film 12' and the first semiconductor film 11'.

In S320c, as shown in FIGS. 15(g) and 16(f), a first electrode material film is formed in the above structure obtained in S310c, and then the first electrode material film is patterned by a photolithography process to form the first electrode(s) 2.

As for a shape and arrangement of the first electrode 2, reference may be made to the descriptions in some of the above examples, and details will not be repeated here.

In some examples, the substrate 8 may have a plurality of chip regions. As shown in FIGS. 13(d), 14(b), 15(f), and 16(e), before the first electrode 2 is formed in S300, for example, before S310a and after S220a, before S320b and after S310b, or before S320c and after S310c, the method for manufacturing the LED chip may further include: further patterning the patterned first semiconductor film 11' to expose the substrate 8.

For example, positions to be further pattered in the first semiconductor film 11' are boundary positions of the plurality of chip regions, and the exposed portions of the substrate 8 is in the shape of a grid. In this way, the boundaries of the LED chips to be formed may be defined, which facilitates subsequent division.

In S400, a plurality of second electrodes 3 is formed. Each second electrode 3 is electrically connected to the second semiconductor pattern 13 in at least one of the plurality of epitaxial structures 1.

For example, the second electrode 3 may be made of Ti, Al, Ni, Au, copper (Cu), indium (In), tin (Sn), silver (Ag), or Sn alloy, etc.

Here, the second electrode 3 may be formed by various methods, which may be selected according to actual needs.

In some examples, after the first electrode(s) 2 is formed in S310a, S400 may include steps 410a to 420a (S410a to S420a).

Figure 13F:
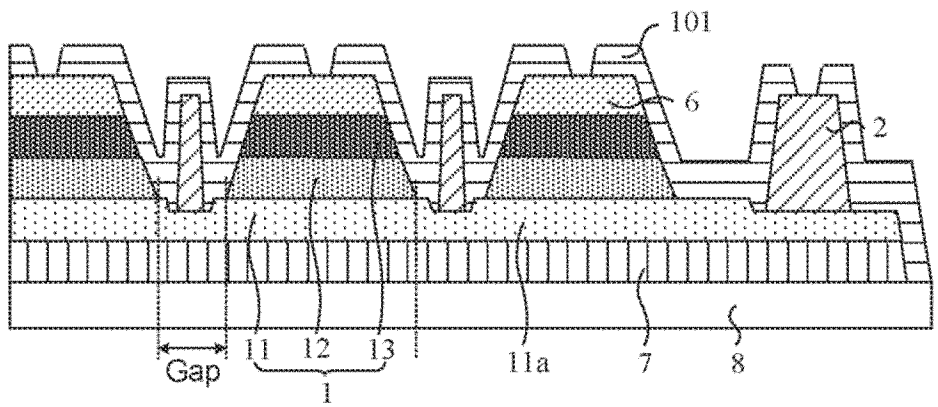
Figure 13G:
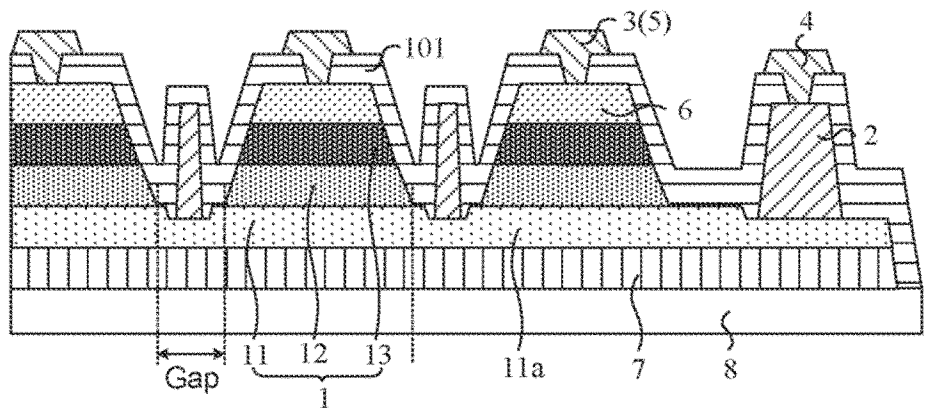
Figure 14A:
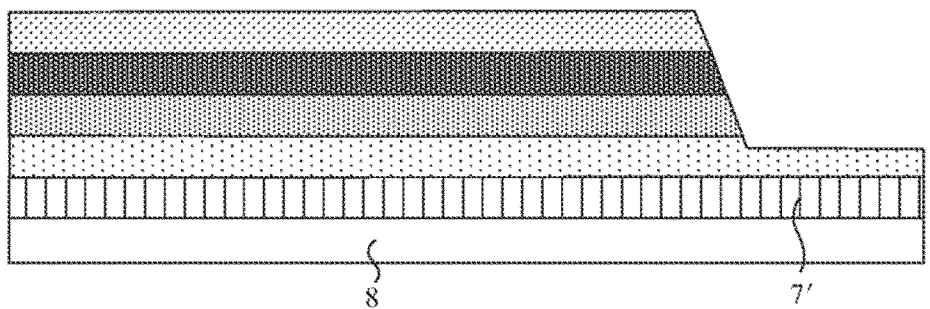
Figure 14B:
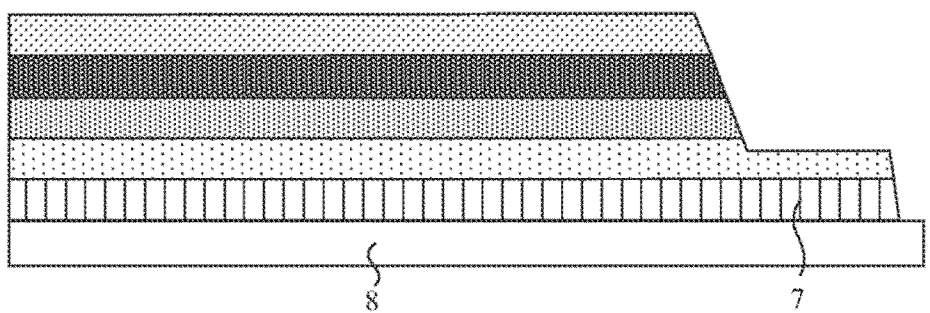
Figure 14C:
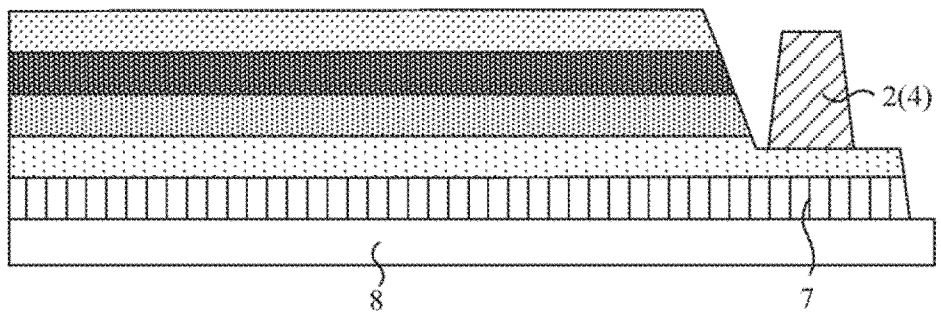
Figure 14D:
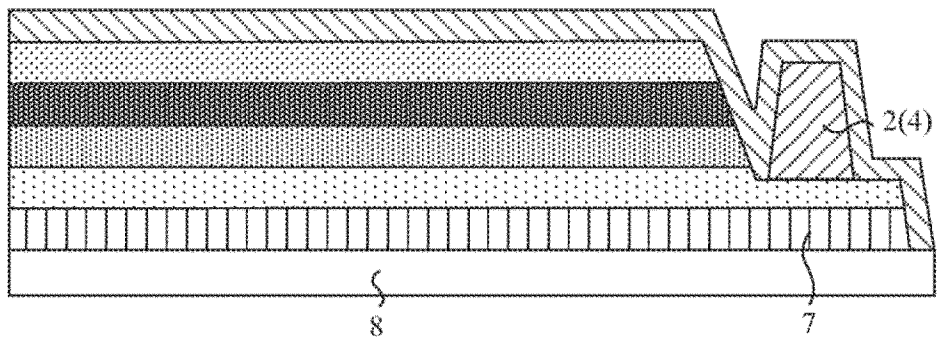
Figure 14E:
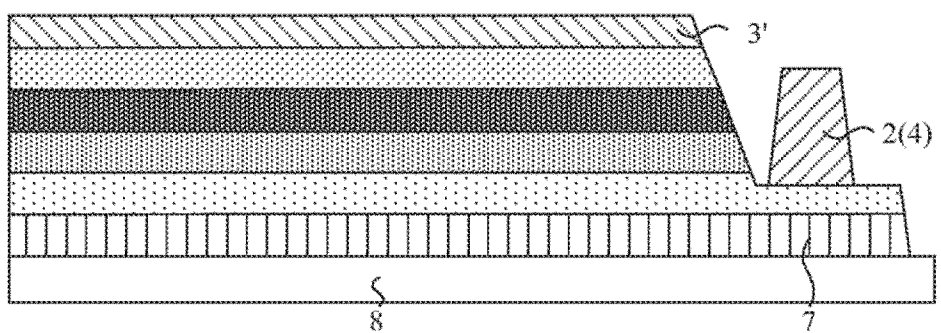
Figure 14F:
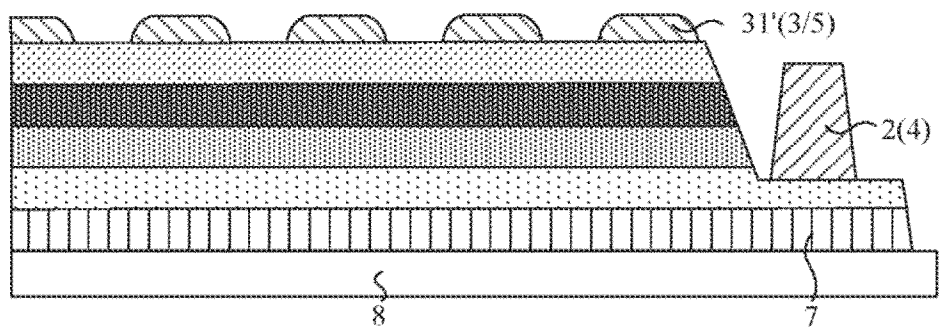
Figure 14G:
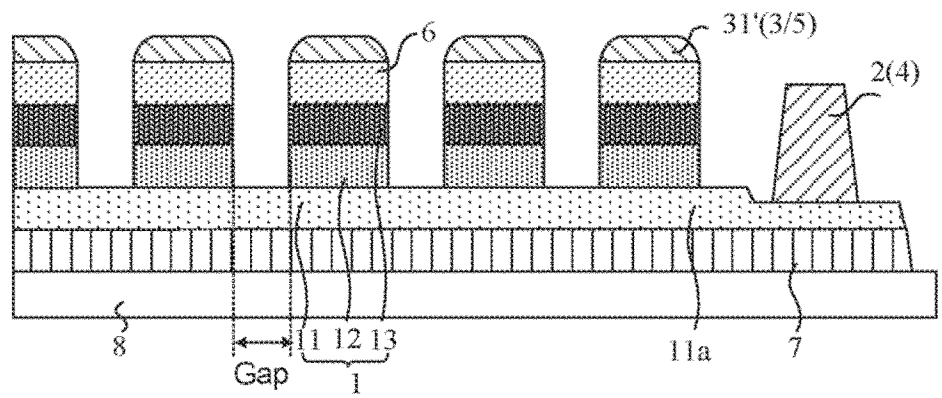
Figure 15A:
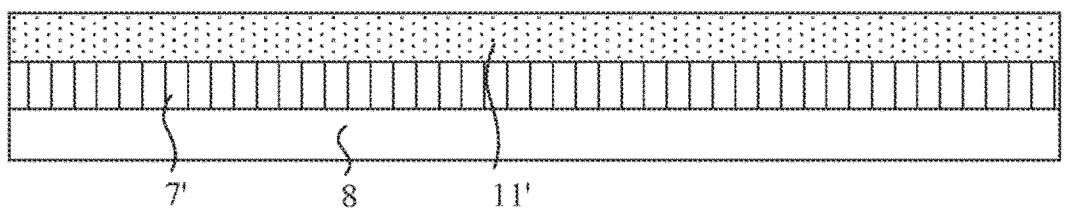
Figure 15B:
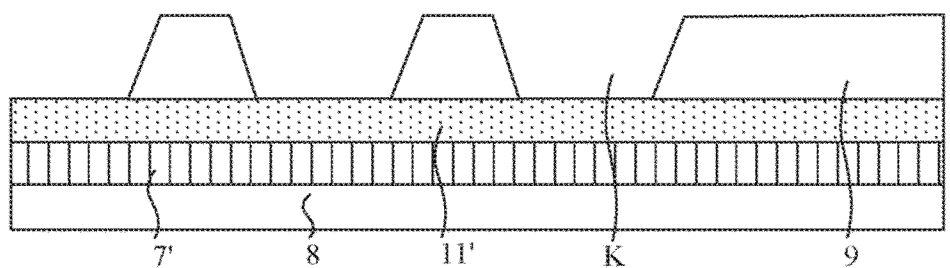
Figure 15C:
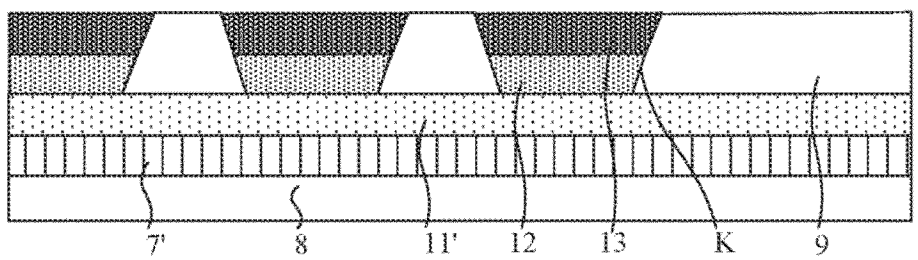
Figure 15D:
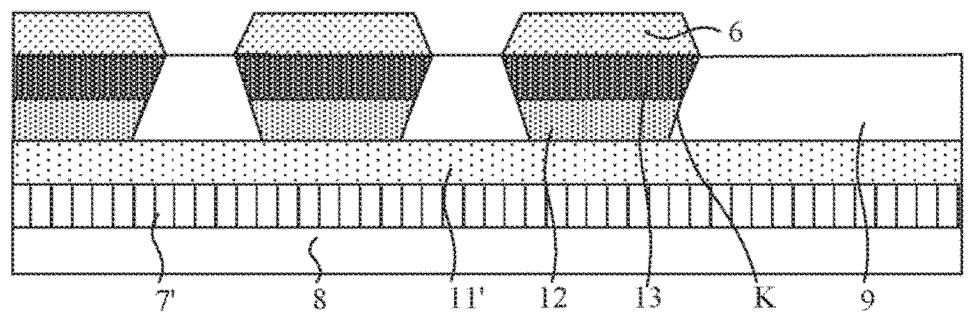
Figure 15E:
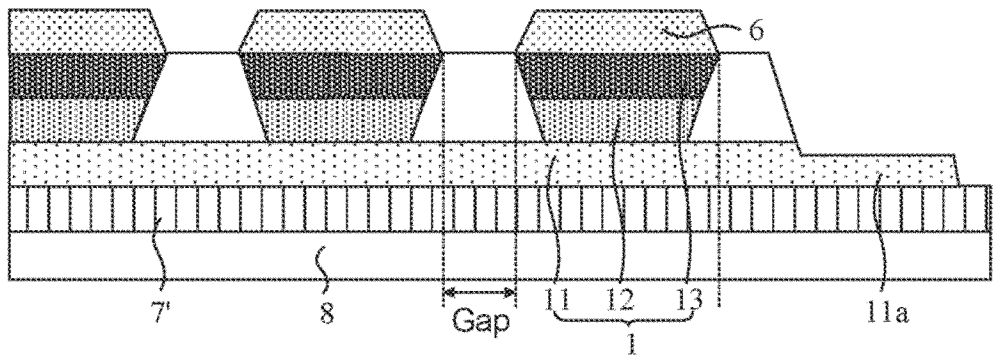
Figure 15F:
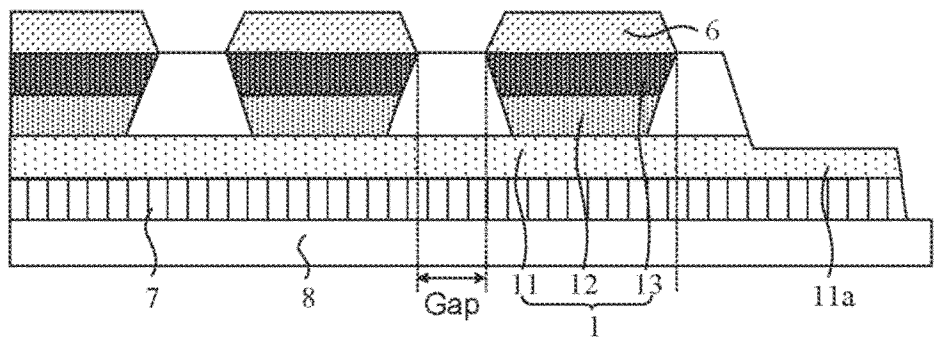
Figure 15G:
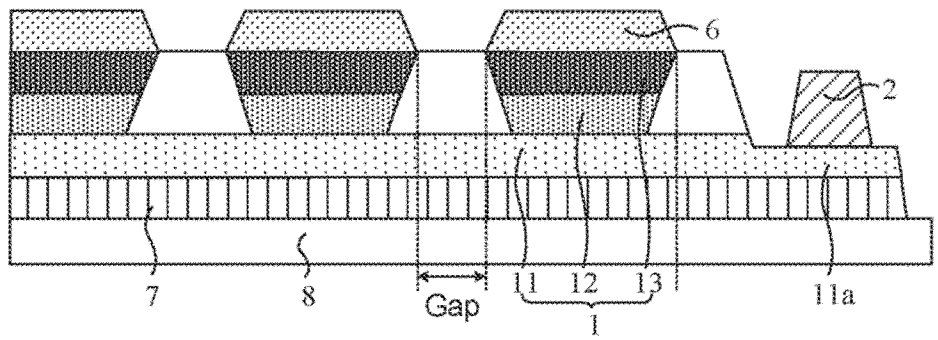
Figure 15H:
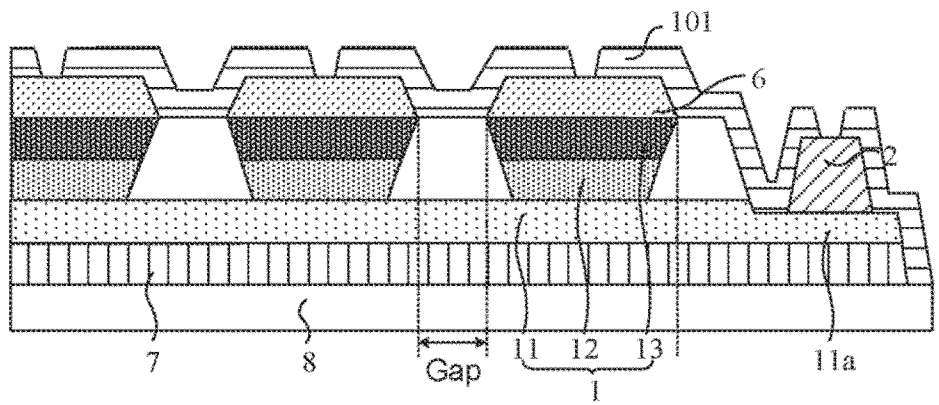
Figure 15I:
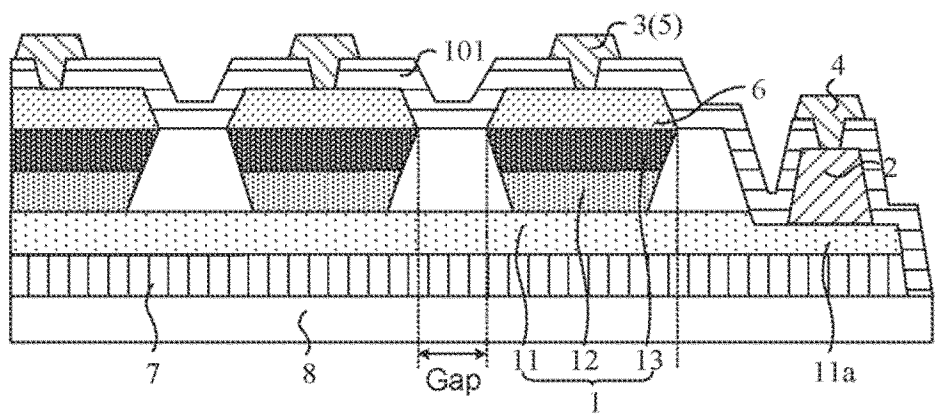
Figure 16A:
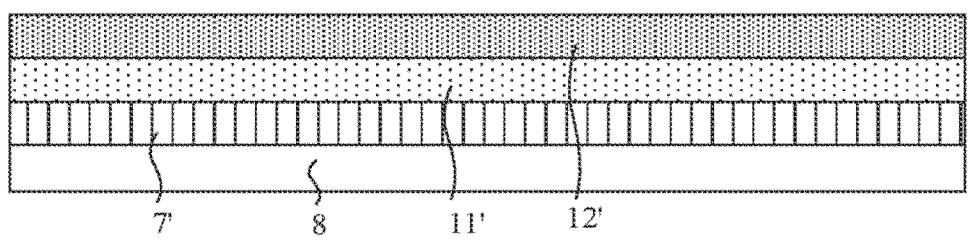
Figure 16B:
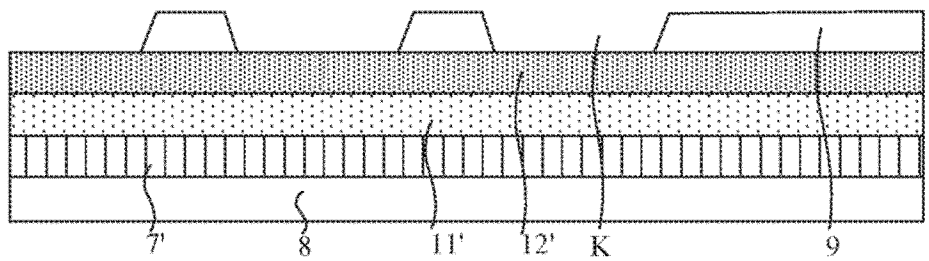
Figure 16C:
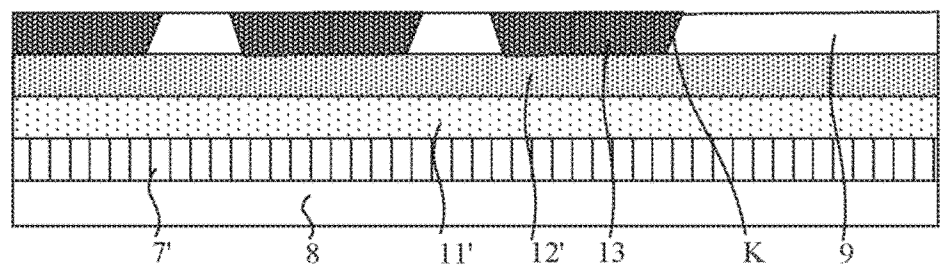
Figure 16D:
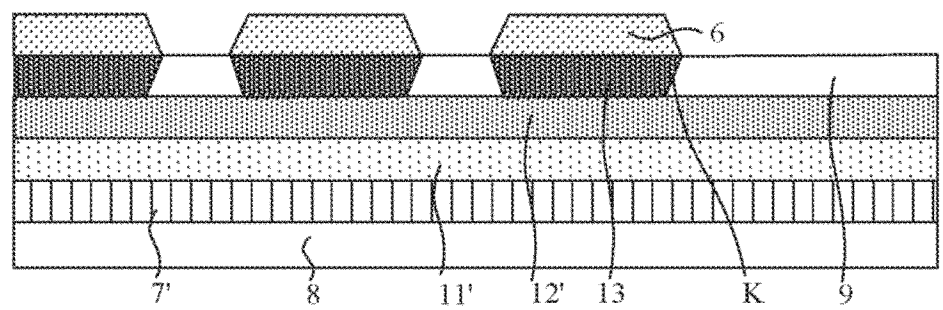
Figure 16E:
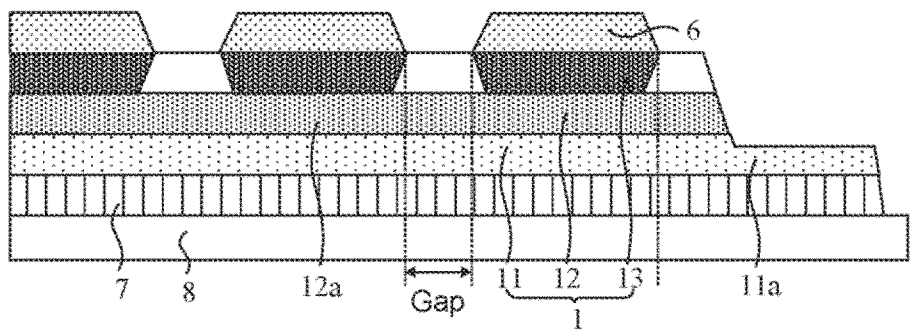
Figure 16F:
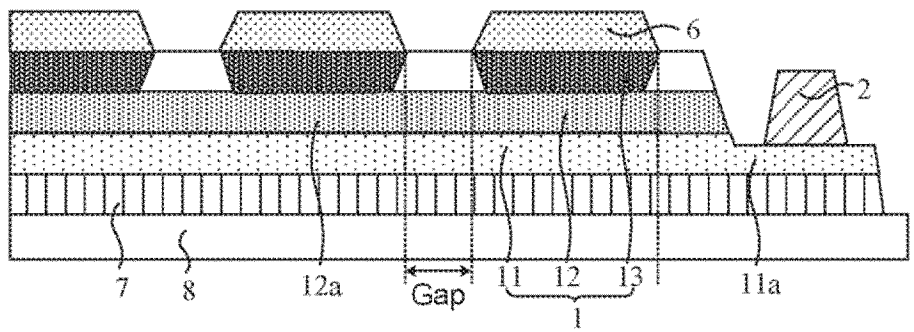
Figure 16G:
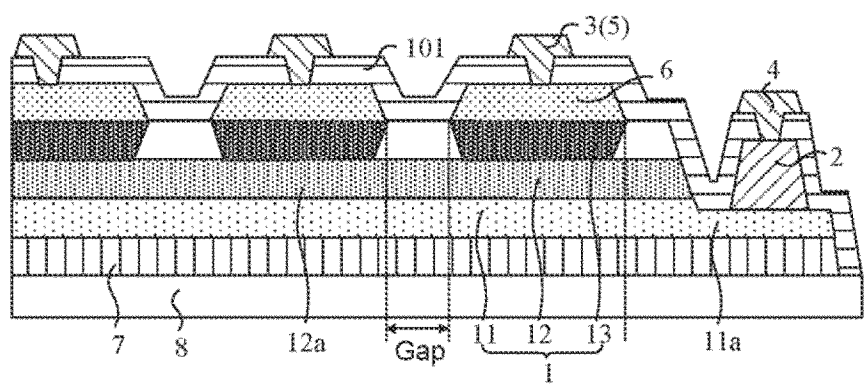
Figure 17:
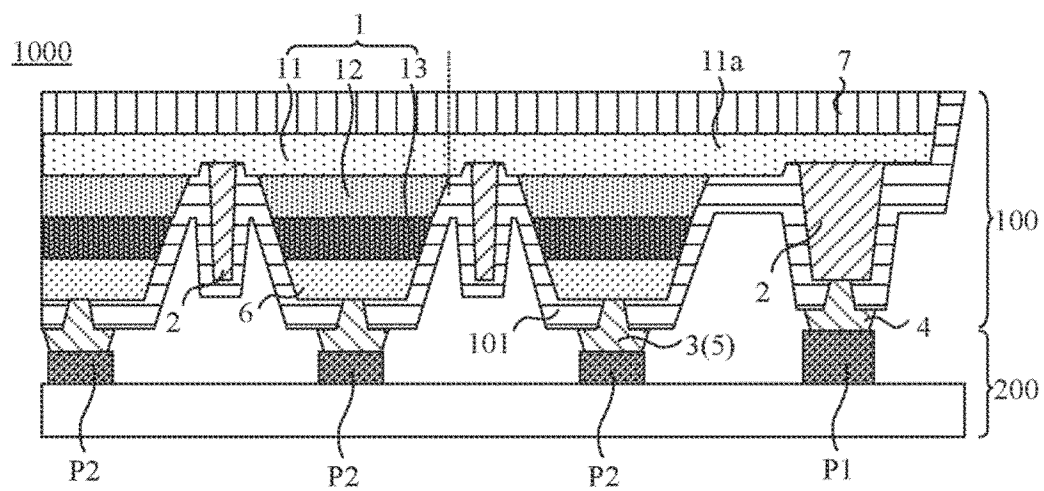

In S410a, as shown in FIG. 13(f), a first insulating film is formed on a side of the epitaxial structures 1 away from the substrate 8. The first insulating film not only covers the plurality of epitaxial structures 1 and the exposed portion of the substrate 8, but is also located in the gap between any two adjacent epitaxial structures 1. Then, the first insulating film is patterned to form vias exposing surfaces of the second semiconductor patterns 13 in the epitaxial structures 1, so as to obtain the first insulating layer 101.

For example, a deposition process may be used to form the first insulating film, and then a photolithography process may be used to pattern the first insulating film. The first insulating film may be of a structure consisting of a single layer of film made of SiO2, SiN or SiON, etc.; or may be of a structure consisting of multiple layers of films made of at least two of SiO2, SiN and SiON that are stacked in sequence.

In S420a, as shown in FIG. 13(g), a second electrode material film is formed on a side of the first insulating layer 101 away from the substrate 8, and then the second electrode material film is patterned to obtain a plurality of second electrodes 3.

For example, a deposition process may be used to form the second electrode material film, and then a photolithography process may be used to pattern the second electrode material film.

Here, as for a shape and arrangement of the second electrode 3, reference may be made to the descriptions in some of the above examples, and details will not be repeated here.

It will be noted that, in a case where the LED chip 100 includes first electrode pin(s) 4 and second electrode pins 5, the insulating film may further cover the first electrode(s) 2. After the first insulating film is patterned, via(s) exposing the first electrode(s) 2 may also be formed; and then after the second electrode material film is patterned, the first electrode pin 4 electrically connected to the first electrode 2 may also be formed.

Here, in a case where the orthographic projection of the epitaxial structure 1 on the first plane is in the shape of the polygon, the second electrode 3 may be used as the second conductive pin 5. In a case where the orthographic projection of the epitaxial structure 1 on the first plane is in the shape of the bar, the second electrode 3 and the second electrode pin 5 may be a one-piece structure.

In the case where the orthographic projection of the epitaxial structure 1 on the first plane is in the shape of the bar, as shown in FIGS. 2 to 5, a second insulating layer 102 may also be formed on a side of the second electrodes 3 away from the substrate 8 to expose the second electrode pin 5 and cover the second electrodes 3 to provide protection.

In some other examples, as shown in FIG. 14(*g*), after the plurality of epitaxial structures 1 are obtained in the above S240*b*, the plurality of conductive particles 31' (which may be used as the mask) may be used as the plurality of second electrodes 3.

It will be noted that, in the case where the LED chip 100 includes the first electrode pin(s) 4 and the second electrode pins 5, the plurality of conductive particles 31' may also be used as the second conductive pins 5. The first electrode 2 formed before S220*b* may also be used as the first conductive pin 4.

In still some other examples, after the first electrode(s) 2 are formed in S320*c*, S400 may include steps 410*c* to 420*c* (S410*c* to S420*c*).

Here, as for description of S410*c* (as shown in FIG. 15(*h*)), for example, reference may be made to S410*a*; as for description of S420*c* (as shown in FIGS. 15(*i*) and 16(*g*)), for example, reference may be made to S420*a*, and details will not be repeated here.

Beneficial effects that may be achieved by the method for manufacturing the LED chip provided by some embodiments of the present disclosure are the same as the beneficial effects that may be achieved by the LED chip 100 provided in some of the above embodiments, and details will not be repeated here.

It will be noted that, the labels of the steps in the above method (for example, "S100", "S200", "S300" or "S400") are only used to show the content of each step more clearly, and do not constitute a limitation on a sequence of the steps for manufacturing the LED chip 100.

In some embodiments, before the above S200, the method for manufacturing the LED chip may further include: forming a buffer layer 7 on the side of the substrate 8.

For example, as shown in FIGS. 13(*a*), 14(*a*), 15(*a*) and 16(*a*), the buffer film 7' may be epitaxially grown on the side of the substrate 8 by the MOCVD process.

In this case, as shown in FIGS. 13(*d*), 14(*b*), 15(*f*), and 16(*e*), in the steps of defining the boundaries of the LED chips to be formed, and further patterning the patterned first semiconductor film 11' to expose the substrate 8, the buffer film 7' is also patterned simultaneously to obtain the buffer layer 7.

In some embodiments, in the above S200, the method for manufacturing the LED chip may include: forming an ohmic contact layer 6 on a side of the second semiconductor pattern 13 in each epitaxial structure 1 away from the substrate 8.

Here, the ohmic contact layer 6 may be formed by various methods, which may be selected according to actual needs.

In some examples, as shown in FIG. 13(*b*), after S210*a* and before S220*a*, an ohmic contact film 6' is formed on a side of the second semiconductor film 13' away from the substrate 8; then, as shown in FIG. 13(*c*), during a process of patterning the second semiconductor film 13', the light-emitting film 12' and the first semiconductor film 11', the ohmic contact film 6' is patterned simultaneously to form the ohmic contact layer 6.

For example, an evaporation process may be used to form the ohmic contact film 6', and then a photolithography process may be used to pattern the ohmic contact film 6'.

Here, considering an influence of the manufacturing process and the structure, an angle between an edge of the formed ohmic contact layer 6 and the first plane may be, for example, an acute angle, as shown in FIG. 13(*c*), so that a cross section of the epitaxial structure 1 is in the shape of the trapezoid.

In some other examples, after S210*b* and before S310*b*, as shown in FIG. 13(*b*), an ohmic contact film 6' is formed on a side of the second semiconductor film 13' away from the substrate 8. Then in S240*b*, as shown in FIG. 14(*g*), during the process of patterning the second semiconductor film 13', the light-emitting film 12' and the first semiconductor film 11', the ohmic contact film 6' is patterned simultaneously to form the ohmic contact layer 6.

For example, an evaporation process may be used to form the ohmic contact film 6', and then a photolithography process may be used to pattern the ohmic contact film 6'.

Here, considering an influence of the manufacturing process and the structure, an angle between an edge of the formed ohmic contact layer 6 and the first plane may be set to be, for example, 90° or approximately 90°, as shown in FIG. 14(*g*), so that a cross section of the epitaxial structure 1 is in the shape of the rectangle.

In still some other examples, as shown in FIGS. 15(*d*) and 16(*d*), after S230*c* and before S310*c*, an ohmic contact film 6' is formed on a side of the plurality of epitaxial structures 1 away from the substrate 8, and then the ohmic contact film 6' is patterned to form the ohmic contact layer 6.

For example, an evaporation process may be used to form the ohmic contact film 6', and then a photolithography process may be used to pattern the ohmic contact film 6'.

Here, considering an influence of the manufacturing process and the structure, an angle between an edge of the formed ohmic contact layer 6 and the first plane may be, for example, an acute angle, as shown in FIGS. 15(*d*) and 16(*d*), so that a cross section of the epitaxial structure 1 is in the shape of the trapezoid.

In some embodiments, after a plurality of LED chips 100 are formed on the substrate 8, the substrate 8 may be stripped off or thinned.

Figure 17:
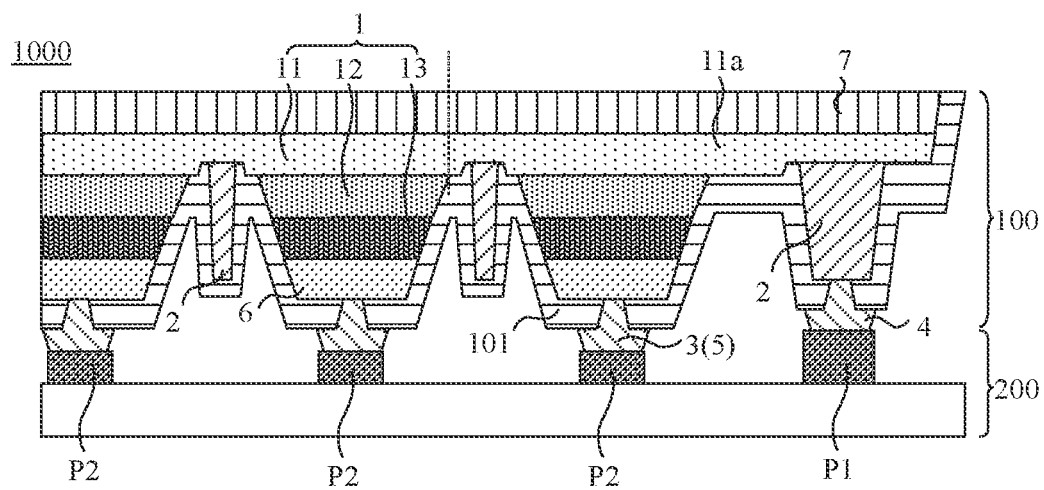
FIG. 17 is a structural diagram of a display device, in accordance with some embodiments of the present disclosure.
Figure 1:
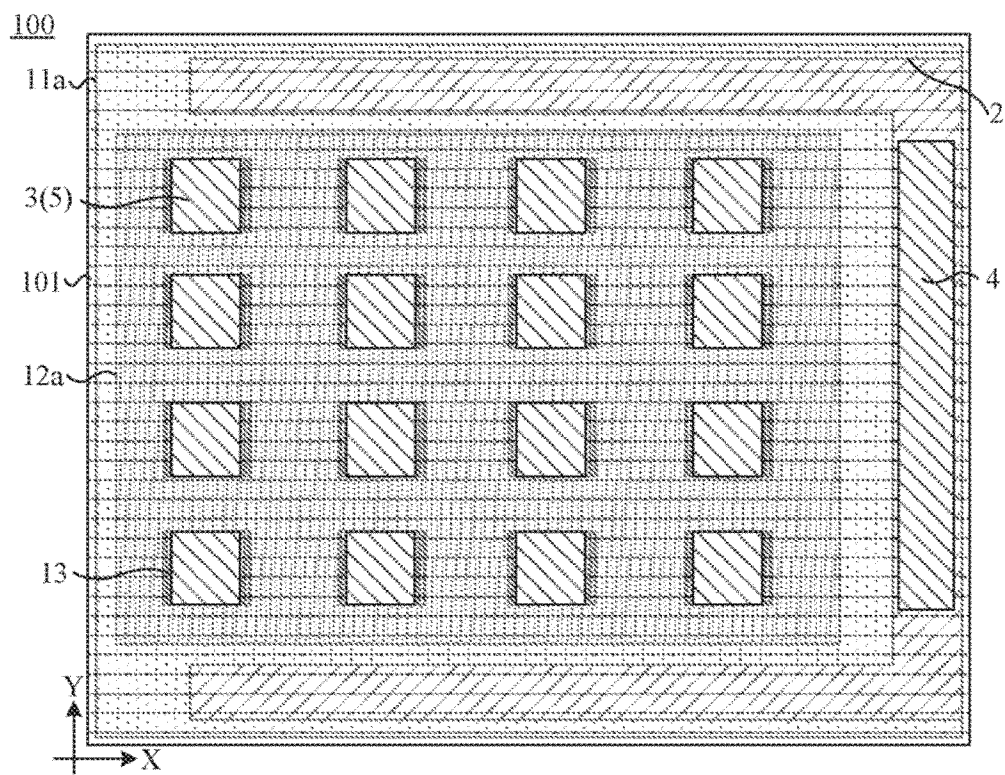
Figure 2:
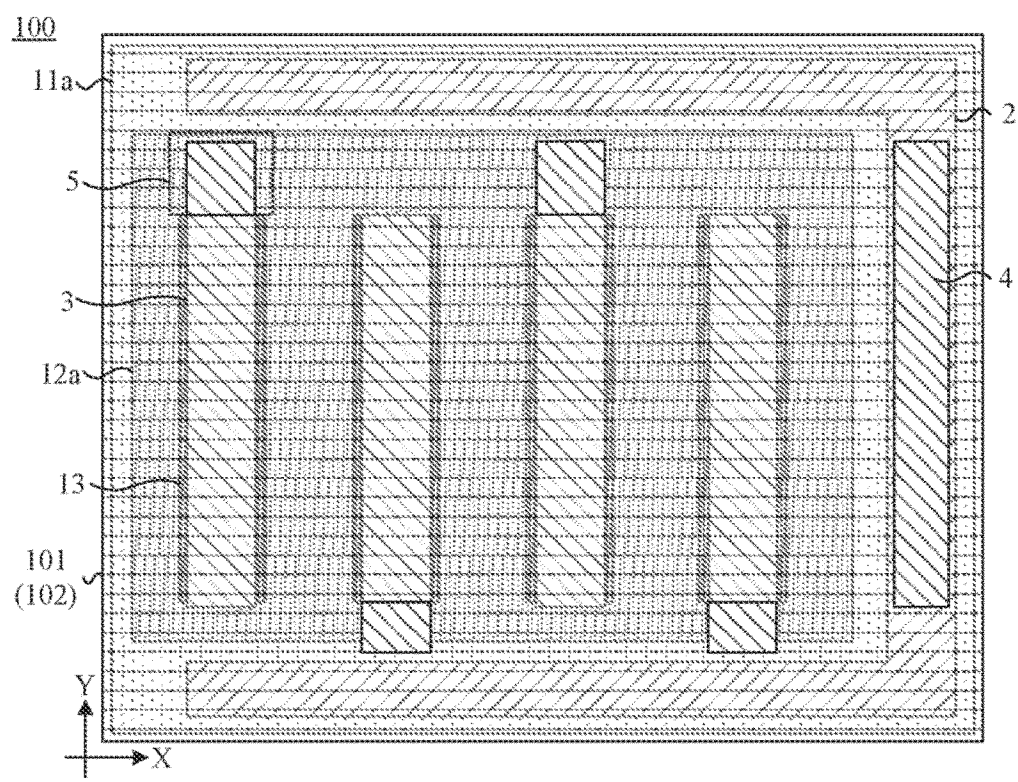
Figure 3:
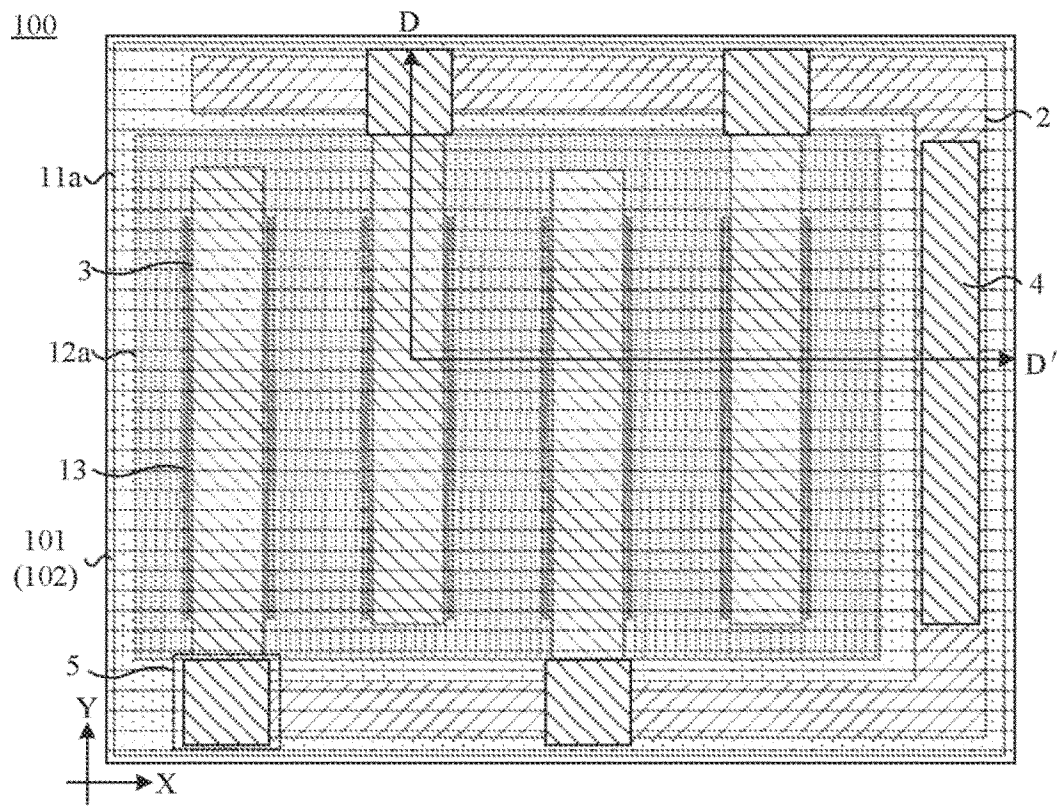
Figure 4:
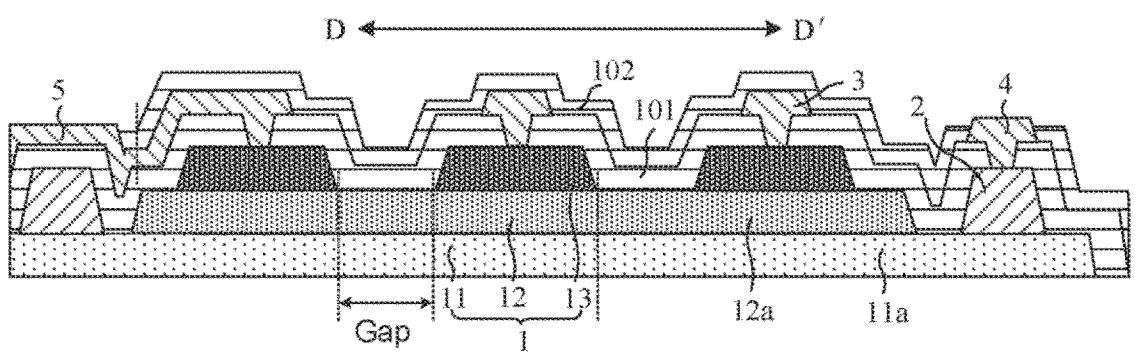
Figure 5:
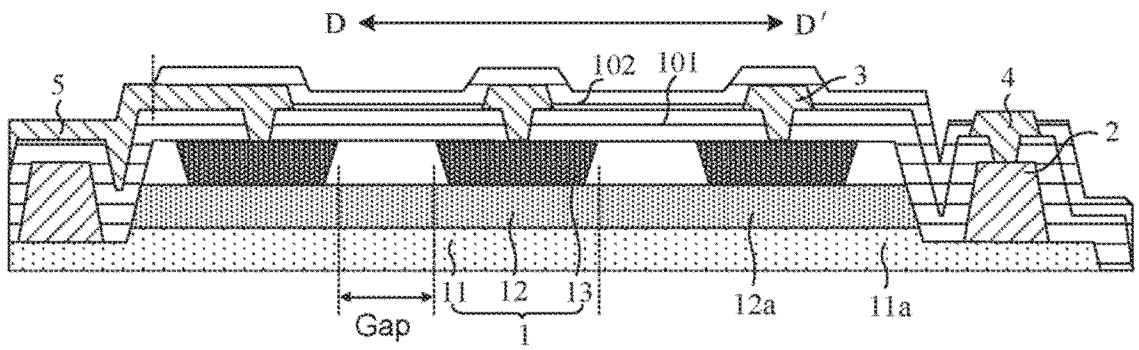
Figure 6:
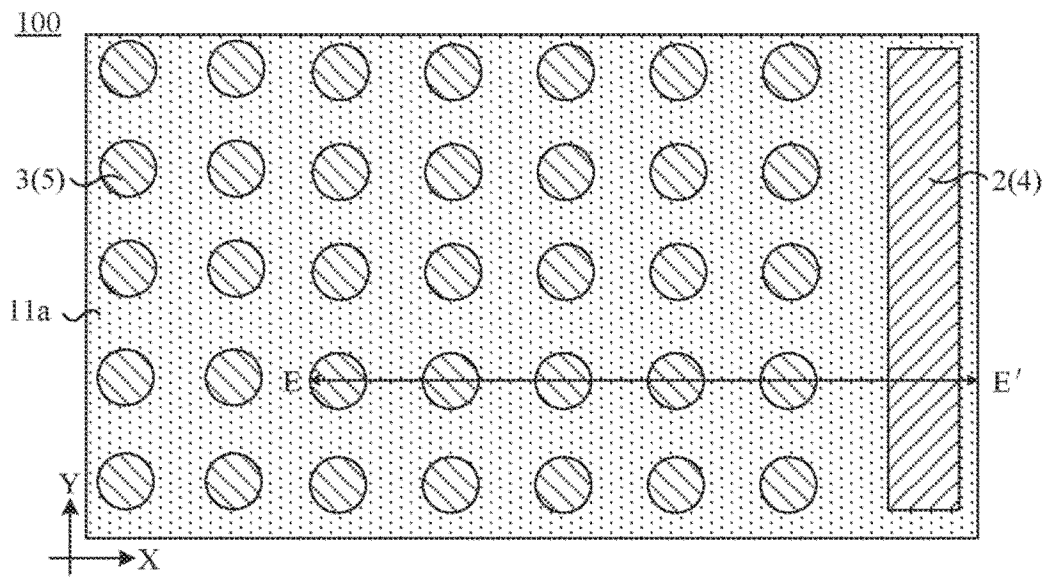
Figure 7:
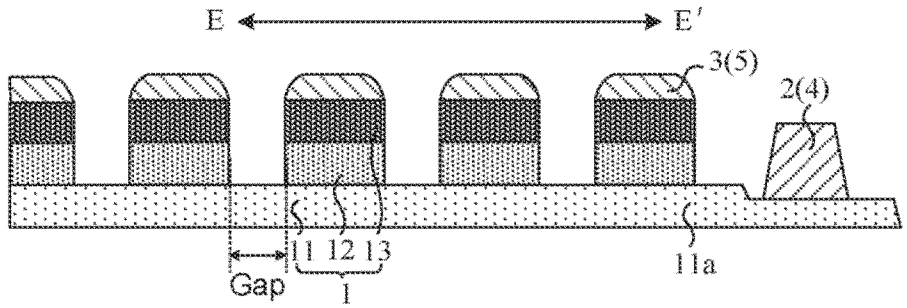
Figure 8:
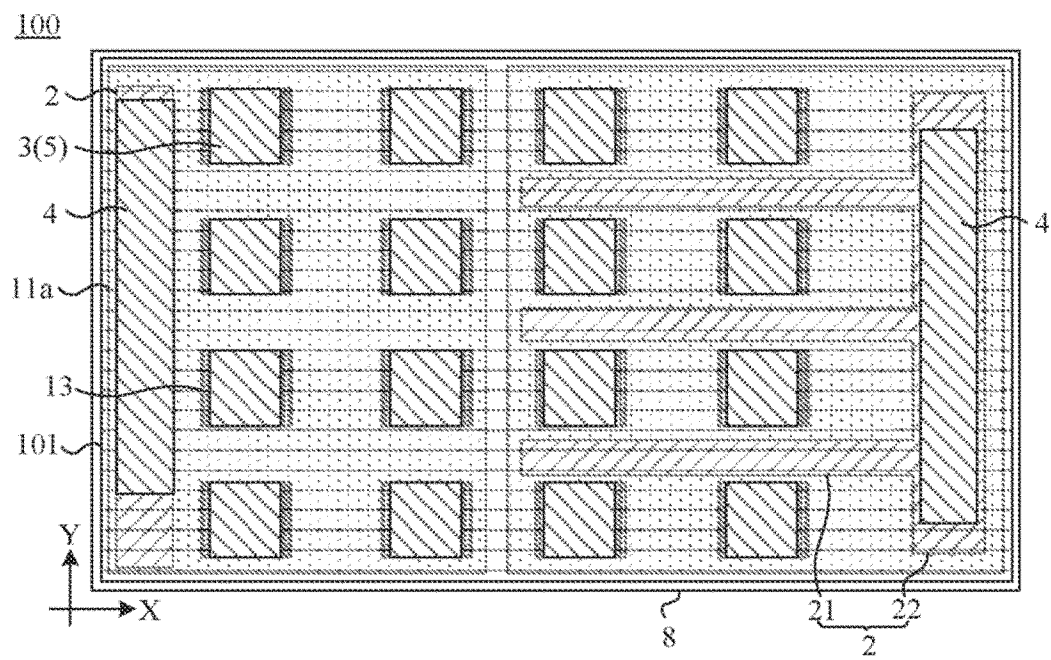
Figure 9:
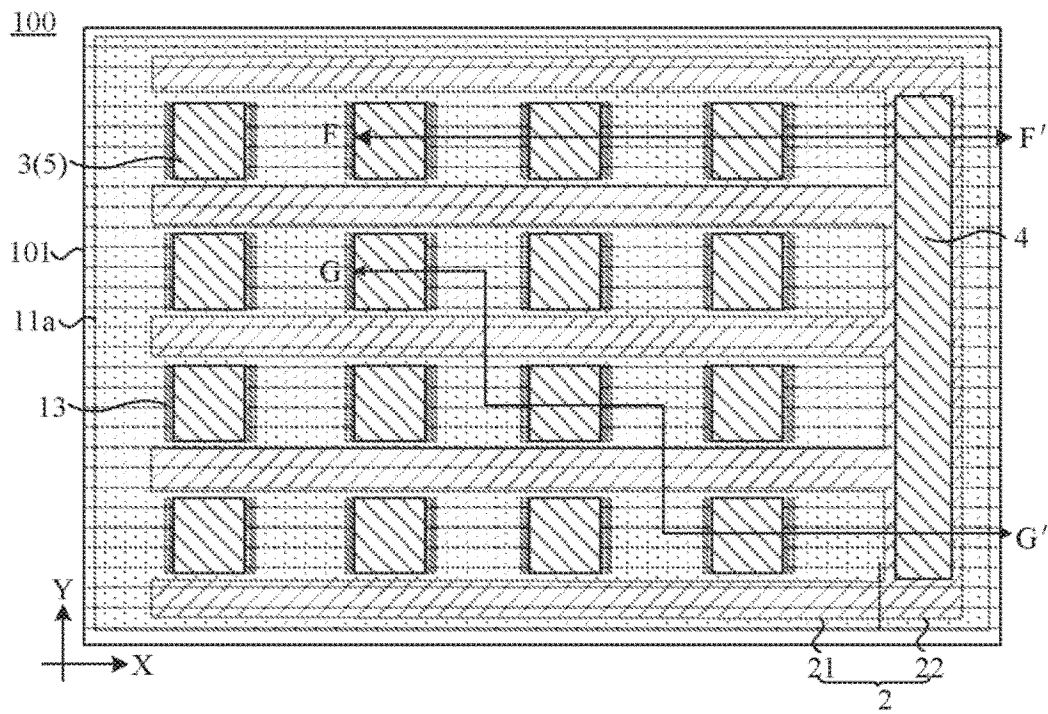
Figure 10:
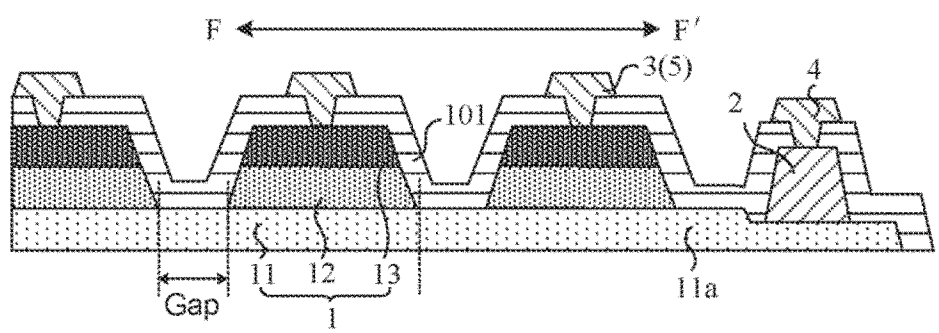
Figure 11:
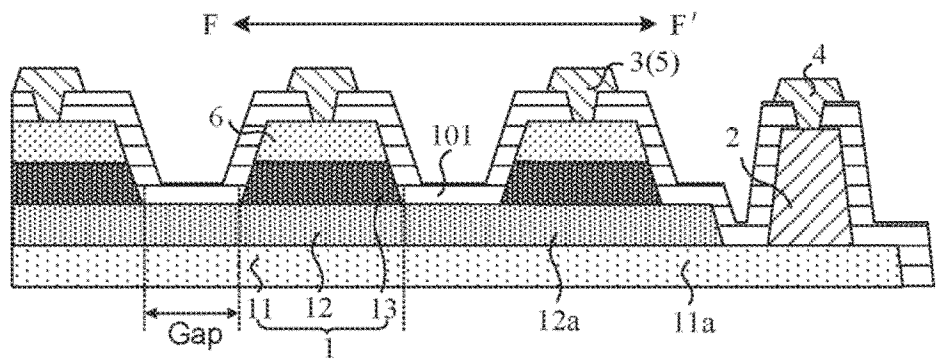
Figure 12:
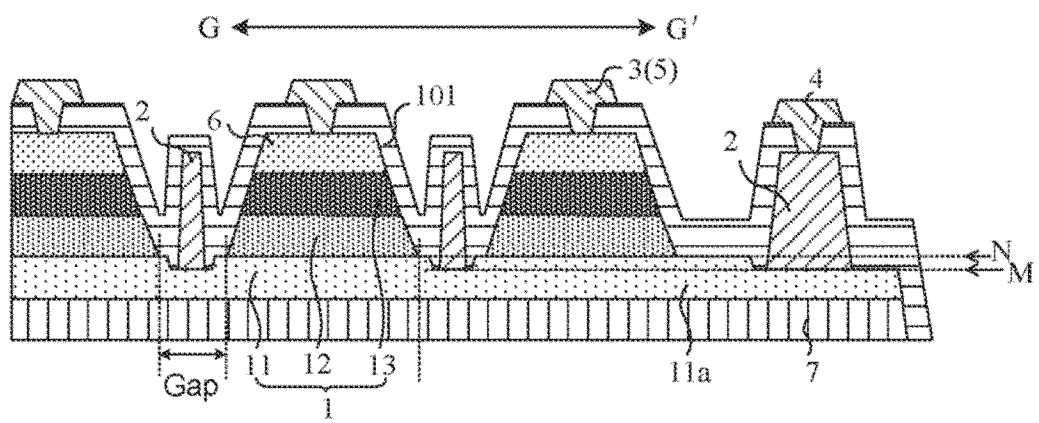

Some embodiments of the present disclosure provide a display device 1000. As shown in FIG. 17, the display device 1000 includes a driving backplane 200, and a plurality of LED chips 100 as described in any of the above embodiments.

In some examples, as shown in FIG. 17, the driving backplane 200 includes a plurality of first pads P1 and a plurality of second pads P2. The first electrode 2 of each LED chip 100 of the plurality of LED chips 100 may be electrically connected to a single first pad P1, and the second electrode 3 of each LED chip 100 may be electrically connected to a single second pad P2.

For example, in each LED chip 100, the number of first electrode(s) 2 is less than the number of second electrodes 3. In this way, the number of first pads P1 electrically connected to the first electrodes 2 is less than the number of second pads P2 electrically connected to the second electrodes 3.

For example, each LED chip 100 has one first electrode 2 and the plurality of second electrodes 3. In this case, each first pad P1 may correspond to second pads P2, and they may be divided into a group to be electrically connected to one LED chip 100.

For example, the driving backplane 200 is configured to, through the first pad P1, transmit electrons to the first electrode 2, which is electrically connected to the first pad P1, of the LED chip 100, and, through the second pad P2, transmit holes to one of the plurality of second electrodes 3, which is electrically connected the second pad P2, of the LED chip 100, so that the electrons and holes recombine in the light-emitting pattern 12 in the corresponding epitaxial structure 1 to emit light.

In some examples, in a case where the LED chip 100 includes the first conductive pin(s) 4 and the second conductive pins 5, the first electrode 2 of each LED chip 100 may be electrically connected to a single first pad P1 through the first conductive pin 4, and the second electrode 3 of each LED chip 100 may be electrically connected to a single second pad P2 through the second conductive pin 5.

The display device 1000 provided in some embodiments of the present disclosure has the same beneficial effects as those of the LED chip 100 provided in some of the above embodiments, and details will not be repeated here.

In some embodiments, the driving backplane 200 may be a backplane in a backlight module of a liquid crystal display (LCD). In this case, the LED chip 100 may be used as a light source, and the display device 1000 may be used as the backlight module in the LCD to provide a backlight for the LCD to display images.

In some other embodiments, the driving backplane 200 may be a display backplane. In this case, the LED chip 100 may be used as a part of a plurality of sub-pixels, and the display device 1000 may be used as an LED display device for displaying images. The display device 1000 may be, for example, a Mini LED display device or a Micro LED display device.

In some embodiments, the display device 1000 is any product or component having a display function, such as a mobile phone, a tablet computer, a television, a display, a notebook computer, a digital photo frame, and a navigator.

The foregoing descriptions are merely specific implementations of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A light-emitting diode (LED) chip, comprising:
    a plurality of epitaxial structures, any two adjacent epitaxial structures of the plurality of epitaxial structures having a gap therebetween, each epitaxial structure including a first semiconductor pattern, a light-emitting pattern and a second semiconductor pattern stacked in sequence, and first semiconductor patterns in at least two of the plurality of epitaxial structures being connected to each other to form a first semiconductor layer;
    at least one first electrode, a first electrode of the at least one first electrode being electrically connected to a respective first semiconductor layer; and
    a plurality of second electrodes, each second electrode being electrically connected to the second semiconductor pattern in at least one of the plurality of epitaxial structures, wherein
    the second semiconductor pattern is disposed independently; and
    an orthographic projection of the first electrode of the at least one first electrode on a first plane is located within an orthographic projection of the respective first semiconductor layer electrically connected to the first electrode of the at least one first electrode on the first plane, and does not overlap with orthographic projections of the plurality of epitaxial structures on the first plane, the first plane being a plane parallel to the first semiconductor layer.

2. The LED chip according to claim 1, wherein the at least one first electrode and the plurality of second electrodes are disposed on a same side of the first semiconductor layer.

3. The LED chip according to claim 1, wherein an orthographic projection of the second electrode on the first plane at least partially overlaps with an orthographic projection of the second semiconductor pattern in the at least one epitaxial structure electrically connected to the second electrode on the first plane.

4. The LED chip according to claim 1, wherein the plurality of epitaxial structures are arranged at intervals along a first direction, and the plurality of epitaxial structures extend along a second direction;
    the first direction intersects the second direction.

5. The LED chip according to claim 4, wherein a plurality of second semiconductor patterns in the plurality of epitaxial structures are arranged at intervals along the first direction, and the second semiconductor patterns extend along the second direction.

6. The LED chip according to claim 5, wherein a plurality of light-emitting patterns in the plurality of epitaxial structures are arranged at intervals along the first direction, and the light-emitting patterns extend along the second direction.

7. The LED chip according to claim 4, wherein the first electrode of the at least one first electrode is arranged around the plurality of epitaxial structures.

8. The LED chip according to claim 1, wherein the plurality of epitaxial structures are arranged in an array.

9. The LED chip according to claim 8, wherein a plurality of second semiconductor patterns in the plurality of epitaxial structures are arranged in an array.

10. The LED chip according to claim 9, wherein a plurality of light-emitting patterns in the plurality of epitaxial structures are arranged in an array.

11. The LED chip according to claim 8, wherein the first electrode of the at least one first electrode is located in the gap between at least two adjacent epitaxial structures in the plurality of epitaxial structures; and
    the first electrode of the at least one first electrode includes at least one first portion extending along a first direction and at least one second portion extending along a second direction, wherein the first direction intersects the second direction.

12. The LED chip according to claim 1, wherein a dimension of the gap between any two adjacent epitaxial structures of the plurality of epitaxial structures ranges from 0.01 μm to 100 μm.

13. The LED chip according to claim 1, further comprising:
at least one first conductive pin, the at least one first conductive pin being located on a side of the at least one first electrode away from the first semiconductor layer and being electrically connected to the at least one first electrode; and
a plurality of second conductive pins, each second conductive pin being electrically connected to a respective second electrode of the plurality of second electrodes.

14. The LED chip according to claim 1, further comprising: an ohmic contact layer provided between the second semiconductor pattern and the second electrode electrically connected thereto.

15. The LED chip according to claim 14, wherein the ohmic contact layer is a transparent ohmic contact layer or a reflective ohmic contact layer.

16. A method for manufacturing a light emitting diode (LED) chip, comprising:
providing a substrate;
forming a plurality of epitaxial structures on a side of the substrate, any two adjacent epitaxial structures of the plurality of epitaxial structures having a gap therebetween, each epitaxial structure including a first semiconductor pattern, a light-emitting pattern and a second semiconductor pattern stacked in sequence, and first semiconductor patterns in at least two of the plurality of epitaxial structures being connected to each other to form a first semiconductor layer;
forming at least one first electrode, a first electrode of the at least one first electrode being electrically connected to a respective first semiconductor layer, wherein the second semiconductor pattern is disposed independently, an orthographic projection of the first electrode of the at least one first electrode on a first plane is located within an orthographic projection of the respective first semiconductor layer electrically connected to the first electrode of the at least one first electrode on the first plane, and does not overlap with orthographic projections of the plurality of epitaxial structures on the first plane, the first plane being a plane parallel to the first semiconductor layer; and
forming a plurality of second electrodes, each second electrode being electrically connected to the second semiconductor pattern in at least one of the plurality of epitaxial structures.

17. The method according to claim 16, wherein forming the plurality of epitaxial structures, includes:
forming a first semiconductor film, a light-emitting film and a second semiconductor film on the side of the substrate in sequence;
forming a conductive film on a side of the second semiconductor film away from the substrate;
annealing the conductive film to form a plurality of conductive particles; and
patterning the second semiconductor film, the light-emitting film and the first semiconductor film to form first semiconductor patterns, light-emitting patterns and second semiconductor patterns by using the plurality of conductive particles as a mask, so as to obtain the plurality of epitaxial structures.

18. The method according to claim 16, wherein forming the plurality of epitaxial structures, includes:
forming a first semiconductor film on the side of the substrate;
forming a defining layer on the first semiconductor film away from the substrate, the defining layer having a plurality of openings; and
forming a light-emitting pattern and a second semiconductor pattern in each opening in sequence, so as to obtain the plurality of epitaxial structures; or
forming the plurality of epitaxial structures, includes:
forming a first semiconductor film and a light-emitting film on the side of the substrate in sequence;
forming a defining layer on the light-emitting film away from the substrate, the defining layer having a plurality of openings; and
forming a second semiconductor pattern in each opening, so as to obtain the plurality of epitaxial structures.

19. A display device, comprising:
a driving backplane, the driving backplane including a plurality of connection pads, and the plurality of connection pads including a plurality of first pads and a plurality of second pads; and
the plurality of LED chips according to claim 1, each first electrode in the plurality of LED chips being electrically connected to a single first pad, and each second electrode of the plurality of LED chips being electrically connected to a single second pad.

20. A method for manufacturing a light emitting diode (LED) chip, comprising:
providing a substrate;
forming a plurality of epitaxial structures on a side of the substrate, any two adjacent epitaxial structures of the plurality of epitaxial structures having a gap therebetween, each epitaxial structure including a first semiconductor pattern, a light-emitting pattern and a second semiconductor pattern stacked in sequence, and first semiconductor patterns in at least two of the plurality of epitaxial structures being connected to each other to form a first semiconductor layer;
forming at least one first electrode, a first electrode of the at least one first electrode being electrically connected to a respective first semiconductor layer; and
forming a plurality of second electrodes, each second electrode being electrically connected to the second semiconductor pattern in at least one of the plurality of epitaxial structures, wherein forming the plurality of epitaxial structures, includes:
forming a first semiconductor film, a light-emitting film and a second semiconductor film on the side of the substrate in sequence;
forming a conductive film on a side of the second semiconductor film away from the substrate;
annealing the conductive film to form a plurality of conductive particles; and
patterning the second semiconductor film, the light-emitting film and the first semiconductor film to form first semiconductor patterns, light-emitting patterns and second semiconductor patterns by using the plurality of conductive particles as a mask, so as to obtain the plurality of epitaxial structures.

* * * * *

UNITED STATES PATENT AND TRADEMARK OFFICE
CERTIFICATE OF CORRECTION

Page 1 of 20

PATENT NO. : 12,021,173 B2
APPLICATION NO. : 17/435016
DATED : June 25, 2024
INVENTOR(S) : Mingxing Wang et al.

It is certified that error appears in the above-identified patent and that said Letters Patent is hereby corrected as shown below:

On the Title Page

Please replace the illustrative print figure, FIG. 4, as shown on the attached drawing sheet 3 of 18.

Delete title page 2 and replace with the attached title page 2 showing the corrected number of drawing sheets.

In the Drawings

Please replace drawing sheets 1-17 with the attached replacement drawing sheets 1-18.

Signed and Sealed this
First Day of April, 2025

Coke Morgan Stewart
*Acting Director of the United States Patent and Trademark Office* the first semiconductor layer. Each second electrode is electrically connected to the second semiconductor pattern in at least one of the plurality of epitaxial structures.

20 Claims, 18 Drawing Sheets

(51) Int. Cl.
  *H01L 33/00*  (2010.01)
  *H01L 33/46*  (2010.01)
  *H01L 33/62*  (2010.01)
(52) U.S. Cl.
  CPC ............. *H01L 33/46* (2013.01); *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 2019/0139932 A1 | 5/2019 | Ting et al. | |
| 2020/0111941 A1* | 4/2020 | Xing | H01L 25/0753 |
| 2020/0203319 A1 | 6/2020 | Lee et al. | |
| 2021/0408106 A1* | 12/2021 | Kishimoto | H01L 27/156 |
| 2022/0059740 A1* | 2/2022 | Hahn | H01L 33/44 |

FOREIGN PATENT DOCUMENTS

| | | |
|---|---|---|
| CN | 110416249 A | 11/2019 |
| CN | 111106210 A | 5/2020 |
| CN | 111293134 A | 6/2020 |
| CN | 211719593 U | 10/2020 |
| WO | 2019/147589 A1 | 8/2019 |

* cited by examiner